United States Patent
You et al.

(10) Patent No.: US 10,910,373 B2
(45) Date of Patent: Feb. 2, 2021

(54) SEMICONDUCTOR DEVICE HAVING ASYMMETRIC FIN-SHAPED PATTERN

(71) Applicant: Samsung Electronics Co., Ltd., Suwon-si (KR)

(72) Inventors: Jung-Gun You, Ansan-si (KR); Se-wan Park, Seoul (KR); Baik-Min Sung, Seoul (KR); Bo-Cheol Jeong, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/794,029

(22) Filed: Feb. 18, 2020

(65) Prior Publication Data
US 2020/0185382 A1    Jun. 11, 2020

Related U.S. Application Data

(63) Continuation of application No. 16/233,301, filed on Dec. 27, 2018, now Pat. No. 10,692,864, which is a
(Continued)

(30) Foreign Application Priority Data

Jan. 15, 2015    (KR) .......................... 10-2015-0007315

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823431* (2013.01); *H01L 21/823481* (2013.01);
(Continued)

(58) Field of Classification Search
None
See application file for complete search history.

(56) References Cited

U.S. PATENT DOCUMENTS 7,538,391 B2    5/2009    Chldambarrao et al.
7,683,437 B2    3/2010    Mikasa
(Continued)

FOREIGN PATENT DOCUMENTS

CN    103296085    9/2013

OTHER PUBLICATIONS

US 8,508,000 B1, 08/2013, Cham et al. (withdrawn)
First Office Action from the Chinese Patent Office dated Mar. 13, 2020, for corresponding application CN 201710605943.0.

*Primary Examiner* — Daniel Whalen
(74) *Attorney, Agent, or Firm* — Muir Patent Law, PLLC

(57) ABSTRACT

Semiconductor devices are provided including a first fin-shaped pattern having first and second sidewalls facing one another and a field insulating film contacting at least a portion of the first fin-shaped pattern. The first fin-shaped pattern includes a lower portion of the first fin-shaped pattern contacting the field insulating film; an upper portion of the first fin-shaped pattern not contacting the field insulating film; a first boundary between the lower portion of the first fin-shaped pattern and the upper portion of the first fin-shaped pattern; and a first fin center line perpendicular to the first boundary and meeting the top of the upper portion of the first fin-shaped pattern. The first sidewall of the upper portion of the first fin-shaped pattern and the second sidewall of the upper portion of the first fin-shaped pattern are asymmetric with respect to the first fin center line.

18 Claims, 18 Drawing Sheets

Related U.S. Application Data continuation of application No. 15/461,934, filed on Mar. 17, 2017, now Pat. No. 10,199,377, which is a continuation of application No. 14/983,904, filed on Dec. 30, 2015, now Pat. No. 9,601,628.

(60) Provisional application No. 62/104,470, filed on Jan. 16, 2015.

(51) Int. Cl.
    *H01L 29/78*     (2006.01)
    *H01L 29/06*     (2006.01)
    *H01L 29/66*     (2006.01)

(52) U.S. Cl.
    CPC .... *H01L 29/0649* (2013.01); *H01L 29/66795* (2013.01); *H01L 29/7851* (2013.01); *H01L 29/7853* (2013.01); *H01L 29/7854* (2013.01)

(56) References Cited

U.S. PATENT DOCUMENTS

| | | | |
|---|---|---|---|
| 7,745,319 B2 | 6/2010 | Tang et al. | |
| 7,759,179 B2 | 7/2010 | Anderson et al. | |
| 8,546,891 B2 | 10/2013 | Chang et al. | |
| 8,747,992 B2 | 6/2014 | Lee et al. | |
| 8,759,173 B2 | 6/2014 | Yeh et al. | |
| 8,759,943 B2 | 6/2014 | Tseng et al. | |
| 8,765,533 B2 | 7/2014 | Hsieh et al. | |
| 8,772,109 B2 | 7/2014 | Colinae | |
| 8,853,008 B1 | 10/2014 | Lee | |
| 2008/0008969 A1 | 1/2008 | Zhou et al. | |
| 2013/0200455 A1 | 8/2013 | Lo et al. | |
| 2013/0221448 A1* | 8/2013 | Chang | H01L 29/66795 257/401 |
| 2014/0001562 A1 | 1/2014 | Liaw | |
| 2014/0264725 A1 | 9/2014 | Chuang et al. | |
| 2014/0284726 A1 | 9/2014 | Lee et al. | |
| 2014/0299942 A1 | 10/2014 | Baek | |
| 2014/0306272 A1 | 10/2014 | Kuo et al. | |
| 2014/0312388 A1 | 10/2014 | Colinge | |
| 2014/0312396 A1 | 10/2014 | Ito | |
| 2014/0312471 A1 | 10/2014 | Hong | |
| 2014/0319624 A1 | 10/2014 | Chi et al. | |
| 2015/0014790 A1 | 1/2015 | Peng | |
| 2015/0115334 A1 | 4/2015 | Liaw | |
| 2015/0115363 A1 | 4/2015 | Chang et al. | |
| 2016/0013183 A1* | 1/2016 | Basker | H01L 21/823431 257/401 |
| 2016/0064377 A1* | 3/2016 | Wang | H01L 21/324 257/401 |
| 2016/0218180 A1 | 7/2016 | You | |
| 2016/0293599 A1 | 10/2016 | You | |
| 2016/0293600 A1 | 10/2016 | You | |
| 2016/0351565 A1 | 12/2016 | Sung | |

\* cited by examiner

SEMICONDUCTOR DEVICE HAVING ASYMMETRIC FIN-SHAPED PATTERN

CROSS REFERENCE TO RELATED APPLICATIONS

This application is a continuation of and claims priority to U.S. patent application Ser. No. 16/233,301, filed Dec. 27, 2018, which is a continuation of U.S. patent application Ser. No. 15/461,934, filed Mar. 17, 2018, which is a continuation of U.S. patent application Ser. No. 14/983,904, filed Dec. 30, 2015 (now U.S. Pat. No. 9,601,628), which application claims priority from Korean Patent Application No. 10-2015-0007315, filed Jan. 15, 2015, and from U.S. Provisional Application No. 62/104,470, filed Jan. 16, 2015, the disclosures of which are hereby incorporated herein by reference in their entireties.

FIELD

Embodiments of the present inventive concept relate generally to semiconductor devices and, more particularly, to multi-gate transistors.

BACKGROUND

Multi-gate transistors use a three-dimensional channel, which can be easily scaled. The multi-gate transistor can improve its current control capability even though its gate length is not increased. In addition, the multi-gate transistor can effectively suppress a short channel effect (SCE) of the voltage of a channel region being influenced by drain voltage.

As one of the scaling technologies for increasing the density of a semiconductor device, there has been proposed a multi-gate transistor in which a fin-shaped silicon body is formed on a substrate and a gate is formed on the surface of the silicon body.

SUMMARY

Some embodiments of the inventive concept provide semiconductor devices whose performance can be improved by increasing a width effect through the adjustment of the shape of a channel of a fin-shaped field effect transistor (FinFET).

Further embodiments of the present inventive concept provide a semiconductor device comprising, a first fin-shaped pattern including a first sidewall and a second sidewall facing each other, and a field insulating film contacting a part of the first fin-shaped pattern, wherein the first fin-shaped pattern includes a lower portion of the first fin-shaped pattern contacting the field insulating film, an upper portion of the first fin-shaped pattern not contacting the field insulating film, a first boundary between the lower portion of the first fin-shaped pattern and the upper portion of the first fin-shaped pattern, and a first fin center line perpendicular to the first boundary and meeting the top of the upper portion of the first fin-shaped pattern, and wherein the first sidewall of the upper portion of the first fin-shaped pattern and the second sidewall of the upper portion of the first fin-shaped pattern are asymmetric with respect to the first fin center line.

In still further embodiments of the present inventive concept, in the upper portion of the first fin-shaped pattern of a first distance from the first boundary, a slope of the first sidewall is defined by a first slope, a slope of the second sidewall is defined by a second slope, a width between the first fin center line and the first sidewall is defined by a first width, and a width between the first fin center line and the second sidewall is defined by a second width, and the first slope and the second slope are different from each other, or the first width and the second width are different from each other.

In some embodiments of the present inventive concept, the first sidewall includes a first inflection point, and the second sidewall includes a second inflection point, and a distance from the first boundary to the first inflection point is different from a distance from the first boundary to the second inflection point.

In further embodiments of the present inventive concept, the first inflection point and the second inflection point are located over an upper surface of the field insulating film.

In still further embodiments of the present inventive concept, the first sidewall of the lower portion of the first fin-shaped pattern and the second sidewall of the lower portion of the first fin-shaped pattern are asymmetric with respect to the first fin center line.

In some embodiments of the present inventive concept, the semiconductor device may further comprise a second fin-shaped pattern which includes a third sidewall and a fourth sidewall facing each other and which is immediately adjacent to the first fin-shaped pattern, a first trench which is formed between the second sidewall of the first fin-shaped pattern and the third sidewall of the second fin-shaped pattern, the second sidewall and the third sidewall facing each other, and a second trench which is formed adjacent to the first sidewall of the first fin-shaped pattern and the fourth sidewall of the second fin-shaped pattern. The field insulating film fills a part of the first trench and a part of the second trench. The second fin-shaped pattern includes a lower portion of the second fin-shaped pattern contacting the field insulating film, an upper portion of the second fin-shaped pattern not contacting the field insulating film, a second boundary between the lower portion of the second fin-shaped pattern and the upper portion of the second fin-shaped pattern, and a second fin center line perpendicular to the second boundary and meeting the top of the upper portion of the second fin-shaped pattern. And the third sidewall of the upper portion of the second fin-shaped pattern and the fourth sidewall of the upper portion of the second fin-shaped pattern are asymmetric with respect to the second fin center line.

In further embodiments of the present inventive concept, the first trench is a trench defining the first fin-shaped pattern and the second fin-shaped pattern, a first depth of the first trench is smaller than a second depth of the second trench, a field center line located away from the first fin center line and the second fin center line by the same distance is defined between the first fin center line and the second fin center line, and the second sidewall of the upper portion of the first fin-shaped pattern and the third sidewall of the upper portion of the second fin-shaped pattern are symmetric with respect to the field center line.

In still further embodiments of the present inventive concept, the second trench defines an active region.

In some embodiments of the present inventive concept, the first trench is formed at both sides of the second fin-shaped pattern. The semiconductor device may further include a third fin-shaped pattern which is defined by the first trench and which includes a fifth sidewall and a sixth sidewall facing each other between the second fin-shaped pattern and the second trench. The third fin-shaped pattern includes a lower portion of the third fin-shaped pattern contacting the field insulating film, an upper portion of the third fin-shaped pattern not contacting the field insulating film, a third boundary between the lower portion of the third fin-shaped pattern and the upper portion of the third fin-shaped pattern, and a third fin center line perpendicular to the third boundary and meeting the top of the upper portion of the third fin-shaped pattern, and the fifth sidewall of the upper portion of the third fin-shaped pattern and the sixth sidewall of the upper portion of the third fin-shaped pattern are asymmetric with respect to the third fin center line.

In further embodiments of the present inventive concept, a first depth of the first trench is equal to or smaller than a second depth of the second trench, and the first trench and the second trench define an active region.

In still further embodiments of the present inventive concept, the semiconductor may further comprise a second fin-shaped pattern including a third sidewall and a fourth sidewall facing each other. The second fin-shaped pattern includes a lower portion of the second fin-shaped pattern contacting the field insulating film, an upper portion of the second fin-shaped pattern not contacting the field insulating film, a second boundary between the lower portion of the second fin-shaped pattern and the upper portion of the second fin-shaped pattern, and a second fin center line perpendicular to the second boundary and meeting the top of the upper portion of the second fin-shaped pattern, and the third sidewall of the second fin-shaped pattern and the fourth sidewall of the second fin-shaped pattern are symmetric with respect to the second fin center line.

In some embodiments of the present inventive concept, the semiconductor may further comprise a gate electrode to cross the first fin-shaped pattern.

Further embodiments of the present inventive concept provide a semiconductor device comprising, a first trench of a first depth, defining a first fin-shaped pattern, a second trench of a second depth larger than the first depth, formed at both sides of the first fin-shaped pattern, and a field insulating film filling a part of the first trench and a part of the second trench, wherein the first fin-shaped pattern includes a lower portion of the first fin-shaped pattern contacting the field insulating film, an upper portion of the first fin-shaped pattern not contacting the field insulating film, a first boundary between the lower portion of the first fin-shaped pattern and the upper portion of the first fin-shaped pattern, and a first fin center line perpendicular to the first boundary and meeting the top of the upper portion of the first fin-shaped pattern, and wherein the first sidewall of the first fin-shaped pattern and the second sidewall of the first fin-shaped pattern are asymmetric with respect to the first fin center line.

In still further embodiments of the present inventive concept, in the first fin-shaped pattern of a first distance from the first boundary, a slope of the first sidewall is defined by a first slope, a slope of the second sidewall is defined by a second slope, a width between the first fin center line and the first sidewall is defined by a first width, and a width between the first fin center line and the second sidewall is defined by a second width. And, the first slope and the second slope are different from each other, or the first width and the second width are different from each other.

In some embodiments of the present inventive concept, the first fin-shaped pattern of the first distance from the first boundary is the upper portion of the first fin-shaped pattern.

In further embodiments of the present inventive concept, the semiconductor device may further comprise a second fin-shaped pattern defined by the first trench and disposed between the first fin-shaped pattern and the second trench.

The second fin-shaped pattern includes a lower portion of the second fin-shaped pattern contacting the field insulating film, an upper portion of the second fin-shaped pattern not contacting the field insulating film, a second boundary between the lower portion of the second fin-shaped pattern and the upper portion of the second fin-shaped pattern, and a second fin center line perpendicular to the second boundary and meeting the top of the upper portion of the second fin-shaped pattern, and the third sidewall of the second fin-shaped pattern and the fourth sidewall of the second fin-shaped pattern are asymmetric with respect to the second fin center line.

In still further embodiments of the present inventive concept, the second sidewall of the first fin-shaped pattern and the third sidewall of the second fin-shaped pattern face each other with the field insulating film located therebetween, a field center line located away from the first fin center line and the second fin center line by the same distance is defined between the first fin center line and the second fin center line, and the second sidewall of the first fin-shaped pattern and the third sidewall of the second fin-shaped pattern are symmetric with respect to the field center line.

In some embodiments of the present inventive concept, the semiconductor may further comprise a third fin-shaped pattern defined by the first trench between the first fin-shaped pattern and the second fin-shaped pattern.

In further embodiments of the present inventive concept, the second trench defines an active region.

In still further embodiments of the present inventive concept, the semiconductor device may further comprise a gate electrode to cross the first fin-shaped pattern.

Some embodiments of the present inventive concept provide a semiconductor device comprising, a first trench of a first depth, defining a first active region and a second active region separated from each other, a second trench of a second depth smaller than the first depth, defining a first fin-shaped pattern in the first active region, a third trench of a third depth smaller than the first depth, defining a second fin-shaped pattern and a third fin-shaped pattern in the second active region, and a field insulating film filling a part of the first trench, a part of the second trench and a part of the third trench, wherein the first fin-shaped pattern includes a lower portion of the first fin-shaped pattern contacting the field insulating film, an upper portion of the first fin-shaped pattern not contacting the field insulating film, a first boundary between the lower portion of the first fin-shaped pattern and the upper portion of the first fin-shaped pattern, and a first fin center line perpendicular to the first boundary and meeting the top of the upper portion of the first fin-shaped pattern, wherein the second fin-shaped pattern includes a lower portion of the second fin-shaped pattern contacting the field insulating film, an upper portion of the second fin-shaped pattern not contacting the field insulating film, a second boundary between the lower portion of the second fin-shaped pattern and the upper portion of the second fin-shaped pattern, and a second fin center line perpendicular to the second boundary and meeting the top of the upper portion of the second fin-shaped pattern, wherein a first sidewall of the first fin-shaped pattern and a second sidewall of the first fin-shaped pattern are asymmetric with respect to the first fin center line, and wherein a third sidewall of the second fin-shaped pattern and a fourth sidewall of the second fin-shaped pattern are asymmetric with respect to the second fin center line.

In further embodiments of the present inventive concept, the third fin-shaped pattern includes a lower portion of the third fin-shaped pattern contacting the field insulating film, an upper portion of the third fin-shaped pattern not contacting the field insulating film, a third boundary between the lower portion of the third fin-shaped pattern and the upper portion of the third fin-shaped pattern, and a third fin center line perpendicular to the third boundary and meeting the top of the upper portion of the third fin-shaped pattern. And, a fifth sidewall of the third fin-shaped pattern and a sixth sidewall of the third fin-shaped pattern are asymmetric with respect to the third fin center line.

In still further embodiments of the present inventive concept, the second fin-shaped pattern and the third fin-shaped pattern are immediately adjacent to each other, the fourth sidewall of the second fin-shaped pattern and the fifth sidewall of the third fin-shaped pattern face each other with the field insulating film located therebetween, a field center line located away from the second fin center line and the third fin center line by the same distance is defined between the second fin center line and the third fin center line, and the fourth sidewall of the second fin-shaped pattern and the fifth sidewall of the third fin-shaped pattern are symmetric with respect to the field center line.

In some embodiments of the present inventive concept, the semiconductor device may further comprise a fourth fin-shaped pattern and a fifth fin-shaped pattern defined by the second trench. The fourth fin-shaped pattern includes a fourth fin center line, and the fourth fin-shaped pattern is asymmetric with respect to the fourth fin center line.

In further embodiments of the present inventive concept, the fifth fin-shaped pattern includes a fifth fin center line, and the fifth fin-shaped pattern is asymmetric with respect to the fifth fin center line.

In still further embodiments of the present inventive concept, the first fin-shaped pattern and the fourth fin-shaped pattern are immediately adjacent to each other with the field insulating film located therebetween, a field center line located away from the first fin center line and the fourth fin center line by the same distance is defined between the first fin center line and the fourth fin center line, and the first fin-shaped pattern and the fourth fin-shaped pattern are symmetric with respect to the field center line.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
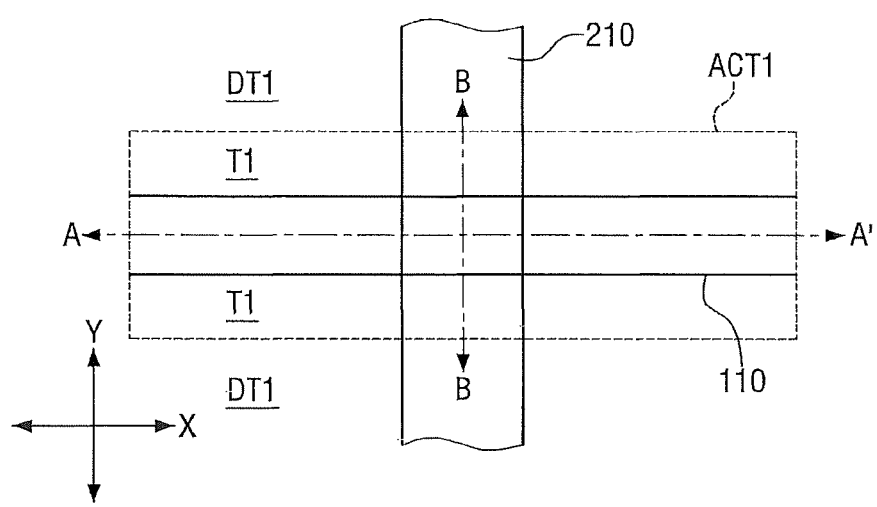
FIG. 1 is a layout diagram illustrating a semiconductor device according to some embodiments of the present inventive concept.

The present inventive concept will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Furthermore, unless defined otherwise, all terms defined in generally used dictionaries may not be overly interpreted.

Figure 2:
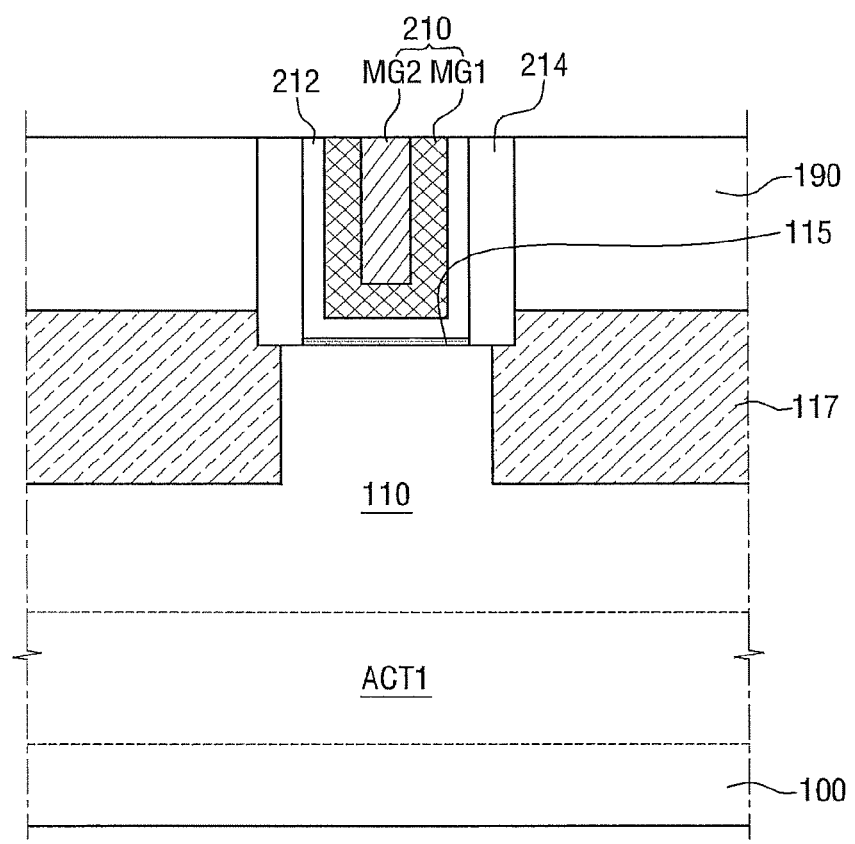
FIG. 2 is a cross section taken along the line A-A' of FIG. 1.
Figure 3A:
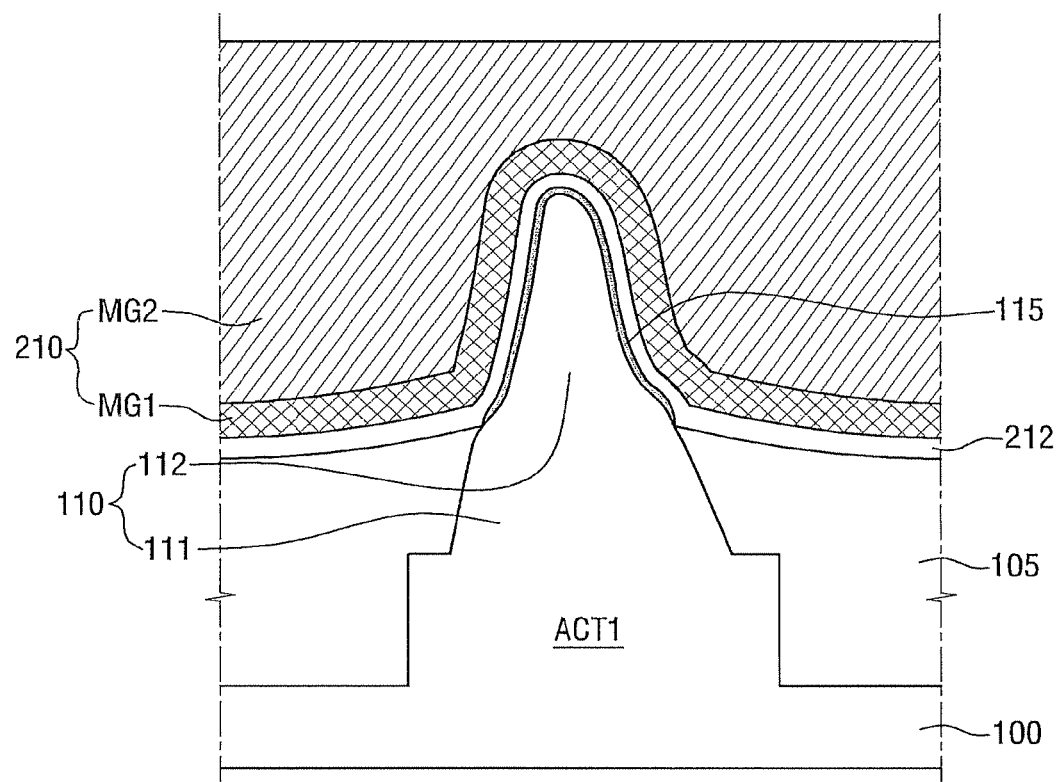
FIG. 3A is a cross section taken along the line B-B' of FIG. 1.
Figure 3B:
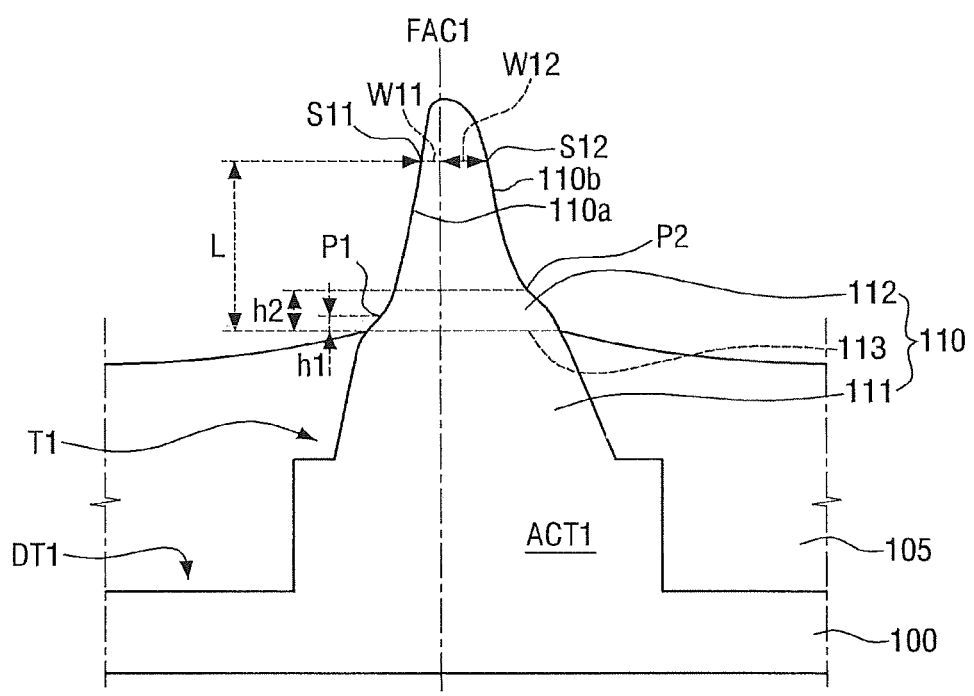
FIG. 3B is a diagram of FIG. 3A excluding a first gate electrode.

Semiconductor device according to some embodiments of the present inventive concept will be discussed with reference to FIGS. 1 to 3B. FIG. 1 is a layout diagram illustrating a semiconductor device according to some embodiment of the present inventive concept. FIG. 2 is a cross section taken along the line A-A' of FIG. 1. FIG. 3A is a cross section taken along the line B-B' of FIG. 1, and FIG. 3B is a view of FIG. 3A excluding a first gate electrode.

Referring now to FIGS. 1 to 3A, the semiconductor device 1 according to some embodiments of the present inventive concept may include a first fin-shaped pattern 110 and a first gate electrode 210. The first fin-shaped pattern 110 may be formed in a first active region (ACT1) of a substrate 100. The first fin-shaped pattern 110 may extend in a first direction (X).

The substrate 100, for example, may be a silicon substrate, a bulk silicon substrate, or a silicon-on-insulator (SOI). In some embodiments, the substrate 100 may include an elemental semiconductor such as germanium, or a compound semiconductor such as a group IV-IV compound semiconductor or a group III-V compound semiconductor. Furthermore, the substrate 100 may be a substrate in which an epitaxial layer is formed on a base plate.

The group IV-IV compound semiconductor, for example, may be a binary compound, a ternary compound, a binary compound doped with a group IV element, or a ternary compound doped with a group IV element, each of which contains at least two of carbon (C), silicon (Si), germanium (Ge), and tin (Sn).

The III-V group compound semiconductor, for example, may be a binary compound, a ternary compound, or a quaternary compound, each of which is formed by the combination of at least one group III element selected from among aluminum (Al), gallium (Ga) and indium (In) with one group V element selected from among phosphorus (P), arsenic (As) and antimony (Sb).

In the semiconductor devices according to some embodiments of the present inventive concept, the first fin-shaped pattern 110 is described as a silicon fin-shaped active pattern containing silicon.

In FIG. 1, the first fin-shaped pattern 110 is shown in the form of a rectangle; however, embodiments of the present inventive concept are not limited thereto. When the first fin-shaped pattern 110 has a rectangular form, it may include a long side and a short side.

A field insulating film 105 may be formed on the substrate 100, and may be disposed around the first fin-shaped pattern 110. The field insulating film 105 may be formed so as to cover a part of the first fin-shaped pattern 110. The first fin-shaped pattern 110 may be defined by the field insulating film 105.

The field insulating film 105, for example, may be an oxide film, a nitride film, an oxynitride film, or a combination thereof.

The first fin-shaped pattern 110 and the field insulating film 105 will be discussed further below with reference to FIG. 3B.

The first gate electrode 210 may extend in a second direction (Y), and may be formed so as to cross the first fin-shaped pattern 110. The first gate electrode 210 may be disposed on the first fin-shaped pattern 110 and the field insulating film 105.

The first gate electrode 210 may include metal layers (MG1 and MG2). As shown in FIGS. 2 and 3A, the first gate electrode 210 may be a laminate of two or more metal layers (MG1 and MG2). In these embodiments, the first metal layer (MG1) serves to adjust a work function, and the second metal layer (MG2) serves to fill the space formed by the first metal layer (MG1). The first metal layer (MG1), for example, may include at least one selected from among TiN, WN, TiAl, TiAlN, TaN, TiC, TaC, TaCN, TaSiN, and combinations thereof, but is not limited thereto. The second metal layer (MG2), for example, may include at least one selected from among W, Al, Cu, Co, Ti, Ta, poly-Si, SiGe, and metal alloys, but is not limited thereto. This first gate electrode 210, for example, may be formed by a replacement process (or a gate last process), but is not limited thereto.

Gate insulating films 115 and 212 may be formed between the first fin-shaped pattern 110 and the first gate electrode 210. The gate insulating films 115 and 212 may include an interfacial film 115 and a high dielectric insulation film 212.

The interfacial layer 115 can be formed by oxidizing a part of the first fin-shaped pattern 110. The interfacial layer 115 may be formed along the profile of the first fin-shaped pattern 110 protruding over the upper surface of the field insulating film 105. When the first fin-shaped pattern is a silicon fin-shaped pattern containing silicon, the interfacial layer 115 may include a silicon oxide film.

The high dielectric insulating film 212 may be formed between the interfacial layer 115 and the first gate electrode 210. The high dielectric insulating film 212 may be formed along the profile of the first fin-shaped pattern 110 protruding over the upper surface of the field insulating film 105. Meanwhile, the high dielectric insulating film 212 may be formed between the first gate electrode 210 and the field insulating film 105.

The high dielectric insulating film 212, for example, may include at least one selected from among silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

A gate spacer 214 may be disposed on the sidewall of the first gate electrode 210 extending in the second direction (Y). The gate spacer 214, for example, may include at least one selected from among silicon nitride (SiN), silicon oxynitride (SiON), silicon oxide (SiO2), silicon oxycarbonitride (SiOCN), and combinations thereof.

Source/drain 117 may be formed on the first fin-shaped pattern 110 at both sides of the first gate electrode 210. The source/drain 117 may be formed by an epitaxial process. The source/drain 117, for example, may be an elevated source/drain.

When the semiconductor device 1 according to some embodiments of the present inventive concept is a PMOS transistor, the source/drain 117 may include a compressive stress material. The compressive stress material may be a material having a lattice constant larger than that of silicon (Si) and may be, for example, SiGe. The compressive stress material can improve the mobility of a carrier in a channel region by applying compressive stress to the first fin-shaped pattern 110.

In embodiments where the semiconductor device 1 is a NMOS transistor, the source/drain 117 may include a tensile stress material. For example, when the first fin-shaped pattern 110 is a silicon fin-shaped pattern, the source/drain 117 may include a material having a small lattice constant (for example, SiC). The tensile stress material can improve the mobility of a carrier in a channel region by applying tensile stress to the first fin-shaped pattern 110.

Referring to FIGS. 1 and 3B, the first fin-shaped pattern 110 may be defined by a first shallow trench (T1) of a first depth, and the first active region (ACT1) may be defined by a first deep trench (DT1) of a second depth larger than the first depth.

In the semiconductor device 1 according to the first embodiment of the present inventive concept, the first shallow trench (T1) and the first deep trenches (DT1) may be disposed on both sides of the first fin-shaped pattern 110.

In these embodiments, the first shallow trench (T1) and the first deep trenches (DT1) may be disposed such that they are immediately adjacent to each other. The first shallow trench (T1) and the first deep trenches (DT1) being immediately adjacent to each other means that another shallow trench of a first depth is not disposed between the first shallow trench (T1) and the first deep trenches (DT1).

The field insulating film 105 may be formed so as to fill at least a portion of the first shallow trench (T1) and a part of the first deep shallow (DT1).

The first fin-shaped pattern 110 may include a first sidewall 110a and a second sidewall 110b facing each other. The first fin-shaped pattern 110 may include an upper portion 112 and a lower portion 111. Furthermore, the first fin-shaped pattern 110 may include a first boundary 113 between the upper portion 112 of first fin-shaped pattern 110 and the lower portion of the first fin-shaped pattern 110.

The field insulating film 105 may contact a part of the first fin-shaped pattern 110. In the first fin-shaped pattern 110, the lower portion thereof 111 may contact the field insulating film 105, and the upper portion thereof 112 may not contact the field insulating film 105.

In other words, the first boundary 113 may be a boundary between the lower portion 111 of the first fin-shaped pattern 110 contacting the field insulating film 105 and the upper portion 112 of the first fin-shaped pattern 110 not contacting the field insulating film 105. The first boundary 113 may be a line connecting the points at which the field insulating film 105 meets the first sidewall 110a and the second sidewall 110b.

Furthermore, the first fin-shaped pattern 110 may include a first fin center line (FAC1) which is perpendicular to the first boundary 113 and meets the top of the first fin-shaped pattern 110. In other words, the first fin center line (FAC1) can meet the top of the upper portion 112 of the first fin-shaped pattern 110.

In these embodiments, the top of the first fin-shaped pattern 110 may be a point at which a line parallel to the first boundary 113 finally meets the first fin-shaped pattern 110. Meanwhile, when the top of the first fin-shaped pattern 110 has a flat surface, the top of the first fin-shaped pattern 110 may be a mid-point of the flat surface.

In the semiconductor device 1 according to the some embodiments of the present inventive concept, the first sidewall 110a and second sidewall 110b of the first fin-shaped pattern 110 may be asymmetric with respect to the first fin center line (FAC1). The first fin-shaped pattern 110 may be asymmetric with respect to the first fin center line (FAC1). For example, with respect to the first fin center line (FAC1), the first sidewall 110a of the upper portion of 112 of the first fin-shaped pattern 110 and the second sidewall 110b of the upper portion of 112 of the first fin-shaped pattern 110 may be asymmetric.

Furthermore, with respect to the first fin center line (FAC1), the first sidewall 110a of the lower portion of 111 of the first fin-shaped pattern 110 and the second sidewall 110b of the lower portion of 111 of the first fin-shaped pattern 110 may be asymmetric; however, embodiments of the present inventive concept are not limited thereto. In other words, the upper portion 112 of the first fin-shaped pattern 110 may be asymmetric, but the lower portion 111 of the first fin-shaped pattern 110 may be symmetric.

In these embodiments, with respect to the first fin center line (FAC1), the asymmetry of the first fin-shaped pattern 110 is defined as follows. First, first distance (L), which is a distance from the first boundary 113, is defined.

In the first fin-shaped pattern 110 of the first distance (L) from the first boundary 113, the slope of the first sidewall 110a is defined by a first slope (S11), and the slope of the second sidewall 110b is defined by a second slope (S12). In the first fin-shaped pattern 110 of the first distance (L) from the first boundary 113, when each of the first sidewall 110a and the second sidewall 110b has a curved surface shape, each of the first slope (S11) and the second slope (S12) may be a slope of a tangent. Furthermore, each of the first slope (S11) and the second slope (S12) may be an absolute value.

In the first fin-shaped pattern 110 of the first distance (L) from the first boundary 113, the width between the first fin center line (FAC1) and the first sidewall 110a may be defined by a first width (W11), and the width between the first fin center line (FAC1) and the second sidewall 110b may be defined by a second width (W12).

In these embodiments, the first fin-shaped pattern 110 of the first distance (L) from the first boundary 113, the slope (S11) of the first sidewall 110a may be different from the slope (S12) of the second sidewall 110b, or the width (W11) between the first fin center line (FAC1) and the first sidewall 110a may be different from the width (W12) between the first fin center line (FAC1) and the second sidewall 110b.

In other words, in the first fin-shaped pattern 110 of the first distance (L) from the first boundary 113, slope or width may be different, or slope and width may be different.

In FIG. 3B, the first fin-shaped pattern 110 of the first distance (L) from the first boundary 113 has been shown to be the upper portion 112 of the first pin-shaped pattern, but is not limited thereto.

Furthermore, the first sidewall 110a of the first fin-shaped pattern 110 may include a first inflection point (p1), and the second sidewall 110b of the first fin-shaped pattern 110 may include a second inflection point (p2). The distance from the first boundary 113 to the first inflection point (p1) may be represented by h1, and the distance from the first boundary 113 to the second inflection point (p2) may be represented by h2.

In the semiconductor device 1 according to some embodiments of the present inventive concept, the distance (h1) from the first boundary 113 to the first inflection point (p1) may be different from the distance (h2) from the first boundary 113 to the second inflection point (p2).

For example, the first inflection point (p1) of the first sidewall (110a) and the second inflection point (p2) of the second sidewall (110b) may be included in the upper portion 112 of the first fin-shaped pattern 112. In other words, the first inflection point (p1) of the first sidewall (110a) and the second inflection point (p2) of the second sidewall (110b) may be located over the upper surface of the field insulating film 105.

Figure 3C:
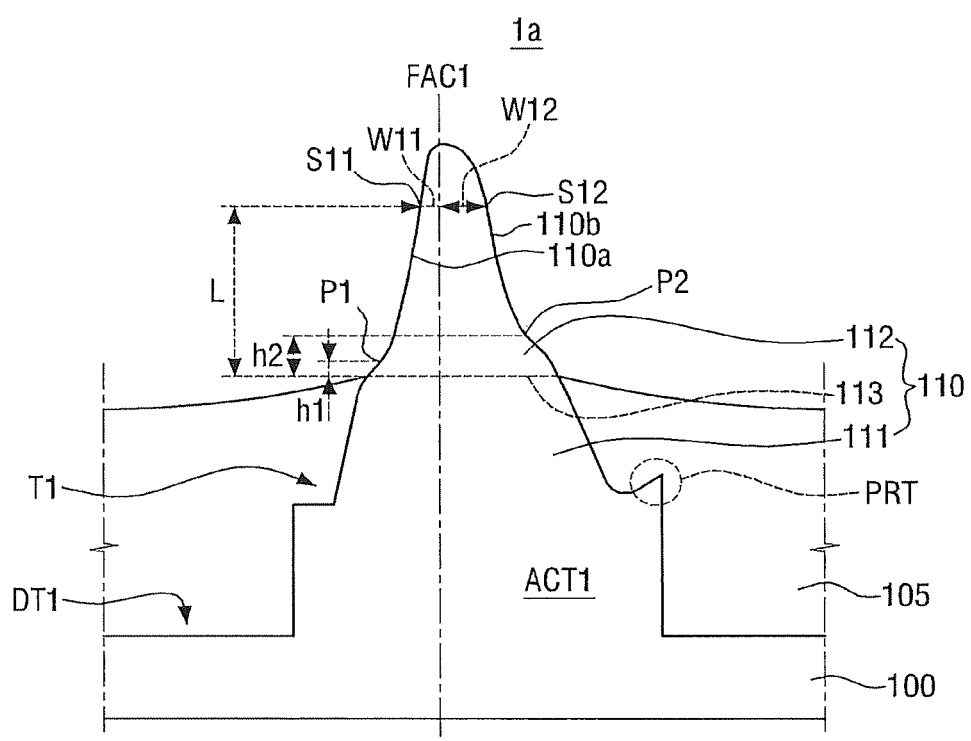
FIG. 3C is a diagram illustrating a modified example of the semiconductor device according to some embodiments of the present inventive concept.

Referring now to FIG. 3C, a diagram illustrating a modified example of the semiconductor device according to some embodiments of the present inventive concept will be discussed. For the convenience of explanation, the modified example thereof will be described focusing on the differences between the embodiments discussed above and embodiments of FIG. 3C, thus, details discussed above will not be repeated herein in the interest of brevity.

As illustrated in FIG. 3C, the modified example (1a) of the semiconductor device according to some embodiments of the present inventive concept may further include a protrusion structure (PRT). The protrusion structure (PRT) may be formed by the protrusion of the bottom of the first shallow trench (T1), and is formed such that it may be located under the upper surface of the field insulating film 105. The protrusion structure (PRT) may be located at the boundary of the first shallow trench (T1) and the first deep trench (DT1).

In FIG. 3C, the protrusion structure (PRT) is formed at one side of the first fin-shaped pattern 110, however, it will be understood that embodiments of the present inventive concept are not limited thereto. In other words, the protrusion structures (PRTs) may also be formed at both sides of the first fin-shaped pattern 110 without departing from the scope of the present inventive concept.

Figure 4:
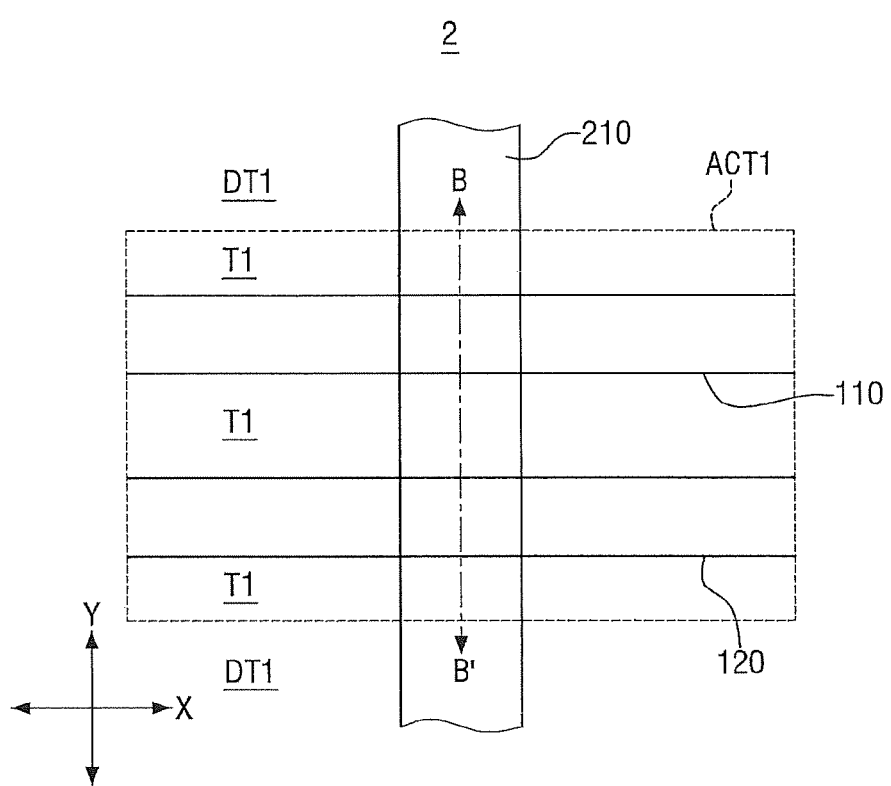
FIG. 4 is a layout diagram illustrating a semiconductor device according to some embodiments of the present inventive concept.
Figure 5:
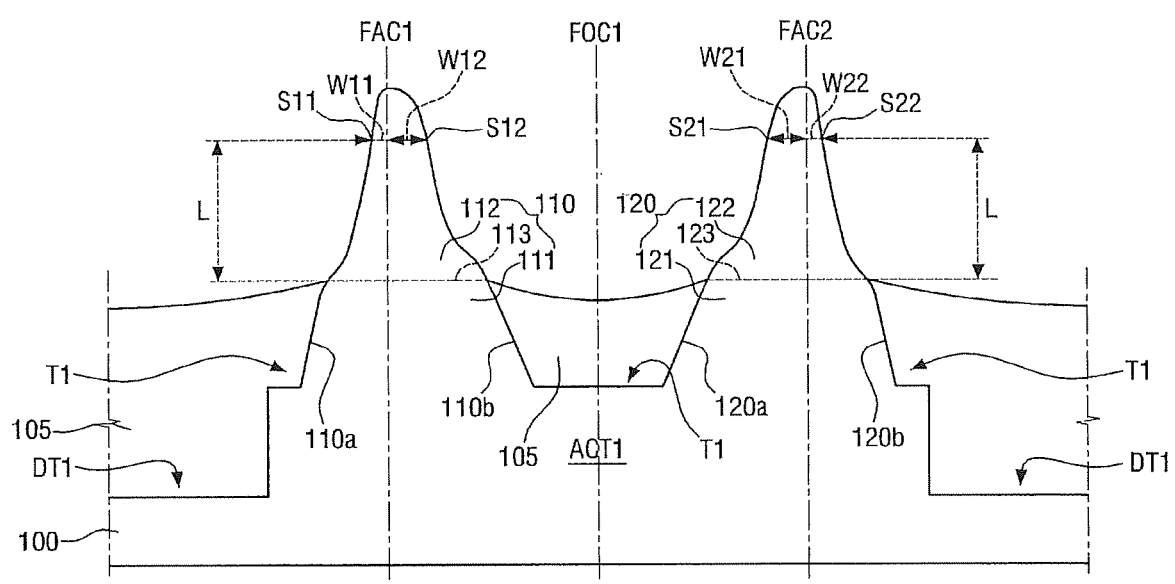
FIG. 5 is a cross section taken along the line B-B' of FIG. 4.

FIG. 4 is a layout diagram illustrating a semiconductor device according to some embodiments of the present inventive concept. FIG. 5 is a cross section taken along the line B-B' of FIG. 4. For the convenience of explanation, the semiconductor device of FIGS. 4 and 5 will be discussed focusing on the differences between embodiments discussed above and embodiments illustrated in FIGS. 4 and 5. FIG. 5 illustrates fin-shaped patterns and a field insulating film excluding a first gate electrode.

Referring now to FIGS. 4 and 5, the semiconductor device 2 according to some embodiments of the present inventive concept may further include a second fin-shaped pattern 120. The second fin-shaped pattern 120 is formed immediately adjacent to the first fin-shaped pattern 110.

The second fin-shaped pattern 120 may be formed in the first active region (ACT1) of the substrate 100. The second fin-shaped pattern 120 may extend in the first direction (X). The field insulation film 105 may contact a part of the second fin-shaped pattern 120.

The second fin-shaped pattern 120 may be defined by the first shallow trench (T1) of a first depth. The first shallow trench (T1) is disposed between the first fin-shaped pattern 110 and the second fin-shaped pattern 120 to separate the first fin-shaped pattern 110 and the second fin-shaped pattern 120. The first shallow trenches (T1) may be disposed both sides of the second fin-shaped pattern 120.

The second fin-shaped pattern 120 may include a third sidewall 120a and a fourth sidewall 120b facing each other. The second fin-shaped pattern 120 may include an upper portion 122 and a lower portion 121. Furthermore, the second fin-shaped pattern 120 may include a second boundary 123 between the upper portion 122 of the second fin-shaped pattern 120 and the lower portion 121 of the second fin-shaped pattern 120.

The first shallow trench (T1) separating the first fin-shaped pattern 110 and the second fin-shaped pattern 120 may be disposed between the second sidewall 110b of the first fin-shaped pattern 110 and the third sidewall 120a of the second fin-shaped pattern 120. The first deep trenches (DT1) defining the first active region (ACT1) may be formed to be respectively adjacent to the first sidewall 110a of the first fin-shaped pattern 110 and the fourth sidewall 120b of the second fin-shaped pattern 120.

The field insulating film 105 may contact a part of the second fin-shaped pattern 120. In the second fin-shaped pattern 120, the lower portion thereof 121 may contact the field insulating film 105, and the upper portion thereof 122 may not contact the field insulating film 105.

Furthermore, the second fin-shaped pattern 120 may include a second fin center line (FAC2) which is perpendicular to the second boundary 123 and meets the top of the second fin-shaped pattern 120. In other words, the second fin center line (FAC2) may meet the top of the upper portion 122 of the second fin-shaped pattern 120.

In the semiconductor device 2 according to some embodiments of the present inventive concept, the first sidewall 110a and second sidewall 110b of the first fin-shaped pattern 110 may be asymmetric with respect to the first fin center line (FAC1), and the third sidewall 120a and fourth sidewall 120b of the second fin-shaped pattern 120 may be asymmetric with respect to the second fin center line (FAC2).

For example, with respect to the second fin center line (FAC2), the third sidewall 120a of the upper portion of 122 of the second fin-shaped pattern 120 and the fourth sidewall 120b of the upper portion of 122 of the second fin-shaped pattern 120 may be asymmetric.

In the second fin-shaped pattern 120 of the first distance (L) from the second boundary 123, the slope of the third sidewall 120a is defined by a third slope (S21), and the slope of the fourth sidewall 120b is defined by a fourth slope (S22). Furthermore, in the second fin-shaped pattern 120 of the first distance (L) from the second boundary 123, the width between the second fin center line (FAC2) and the third sidewall 120a is defined by a third width (W21), and the width between the second fin center line (FAC2) and the fourth sidewall 120b is defined by a fourth width (W22).

In these embodiments, in the second fin-shaped pattern 120 of the first distance (L) from the second boundary 123, the slope (S21) of the third sidewall 120a may be different from the slope (S22) of the fourth sidewall 120b, or the width (W21) between the second fin center line (FAC2) and the third sidewall 120a may be different from the width (W22) between the second fin center line (FAC2) and the fourth sidewall 120b.

Furthermore, a first field center line (FOC1) located away from the first fin center line (FAC1) and the second fin center line (FAC2) by the same distance may be defined between the first fin center line (FAC1) and the second fin center line (FAC2).

In the semiconductor device 2 according to some embodiments of the present inventive concept, the first fin-shaped pattern 110 and the second fin-shaped pattern 120 may be symmetric with respect to the first field center line (FOCI). With respect to the first field center line (FOC1), the second sidewall 110b of the first fin-shaped pattern 110 and the third sidewall 120a of the second fin-shaped pattern 120 may be symmetric, and the first sidewall 110a of the first fin-shaped pattern 110 and the fourth sidewall 120b of the second fin-shaped pattern 120 may be symmetric.

For example, the slope (S21) of the third sidewall 120a may be substantially equal to the slope (S12) of the second sidewall 110b, and the slope (S22) of the fourth sidewall 120b may be substantially equal to the slope (S11) of the first sidewall 110a. Furthermore, the width (W11) between the first fin center line (FAC1) and the first sidewall 110a may be substantially equal to the width (W22) between the second fin center line (FAC2) and the fourth sidewall 120b, and the width (W12) between the first fin center line (FAC1) and the second sidewall 110b may be substantially equal to the width (W21) between the second fin center line (FAC2) and the third sidewall 120a.

Figure 6:
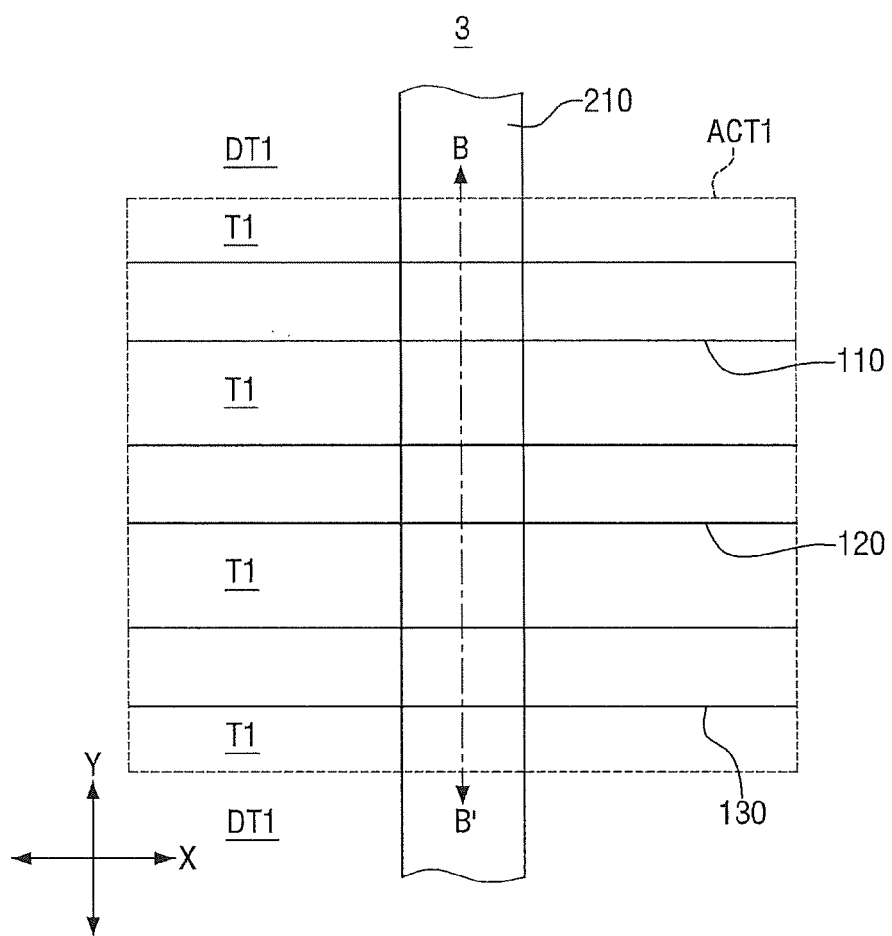
FIG. 6 is a layout diagram for illustrating a semiconductor device according to some embodiments of the present inventive concept.
Figure 7:
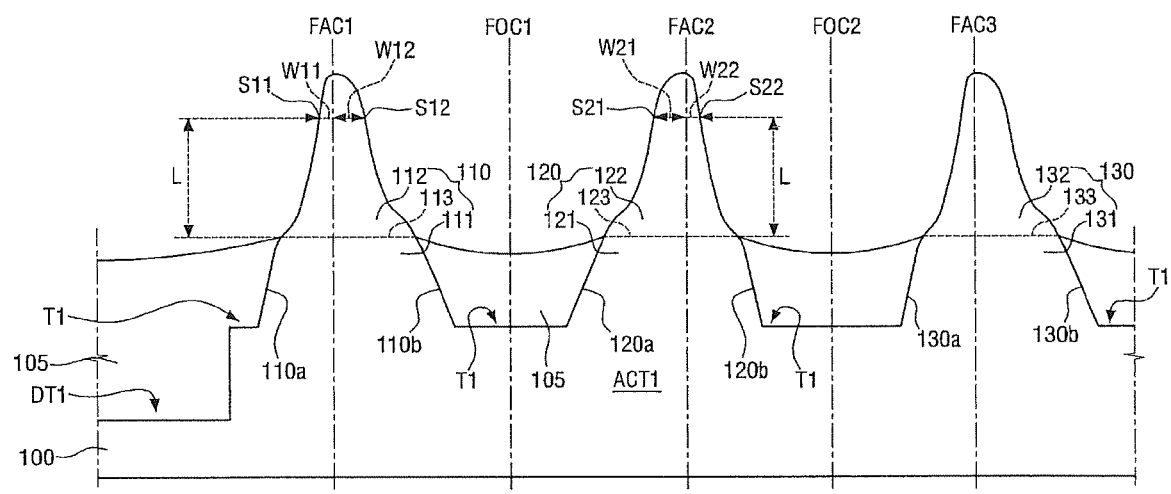
FIG. 7 is a cross section taken along the line B-B' of FIG. 6.

FIG. 6 is a layout diagram illustrating a semiconductor device according to some embodiments of the present inventive concept. FIG. 7 is a cross section taken along the line B-B' of FIG. 6. For the convenience of explanation, the semiconductor device according to some embodiments of the present inventive concept illustrated in FIGS. 6 and 7 will be discussed focusing on the differences between the embodiments discussed above and embodiments illustrated in FIGS. 6 and 7. FIG. 7 illustrates fin-shaped patterns and a field insulating film excluding a first gate electrode.

Referring to FIGS. 6 and 7, the semiconductor device 3 according to some embodiments of the present inventive concept may further include a third fin-shaped pattern 130. The third fin-shaped pattern 130 may be formed between the second fin-shaped pattern 120 and the first deep trench (DT1).

The third fin-shaped pattern 130 may be formed in the first active region (ACT1) of the substrate 100. The third fin-shaped pattern 130 may extend in the first direction (X). The field insulation film 105 may contact a part of the third fin-shaped pattern 130.

The third fin-shaped pattern 130 may be defined by the first shallow trench (T1) of a first depth. The first shallow trench (T1) is disposed between the second fin-shaped pattern 120 and the third fin-shaped pattern 130 to separate the second fin-shaped pattern 120 and the third fin-shaped pattern 120. The first shallow trenches (T1) may be disposed on both sides of the third fin-shaped pattern 130.

The third fin-shaped pattern 130 may include a fifth sidewall 130a and a sixth sidewall 130b facing each other. The third fin-shaped pattern 130 may include an upper portion 132 and a lower portion 131. Furthermore, the third fin-shaped pattern 130 may include a third boundary 133 between the upper portion 132 of the third fin-shaped pattern 130 and the lower portion 131 of the third fin-shaped pattern 130.

In the third fin-shaped pattern 130, the lower portion thereof 131 may contact the field insulating film 105, and the upper portion thereof 132 may not contact the field insulating film 105.

Furthermore, the third fin-shaped pattern 130 may include a third fin center line (FAC3) which is perpendicular to the third boundary 133 and meets the top of the third fin-shaped pattern 130. In other words, the third fin center line (FAC3) may meet the top of the upper portion 132 of the third fin-shaped pattern 130.

In the semiconductor device 3 according to the some embodiments of the present inventive concept, the fifth sidewall 130a and sixth sidewall 130b of the third fin-shaped pattern 130 may be asymmetric with respect to the third fin center line (FAC3). For example, with respect to the third fin center line (FAC3), the fifth sidewall 130a of the upper portion of 132 of the third fin-shaped pattern 130 and the sixth sidewall 130b of the upper portion of 132 of the second fin-shaped pattern 130 may be asymmetric.

Furthermore, a second field center line (FOC2) located away from the second fin center line (FAC2) and the third fin center line (FAC3) by the same distance may be defined between the second fin center line (FAC2) and the third fin center line (FAC3).

In the semiconductor device 3 according to some embodiments of the present inventive concept, the second fin-shaped pattern 120 and the third fin-shaped pattern 130 may be symmetric with respect to the second field center line (FOC2). With respect to the second field center line (FOC2), the fourth sidewall 120b of the second fin-shaped pattern 120 and the fifth sidewall 130a of the third fin-shaped pattern 130 may be symmetric, and the third sidewall 120a of the second fin-shaped pattern 120 and the sixth sidewall 130b of the third fin-shaped pattern 130 may be symmetric.

Figure 8:
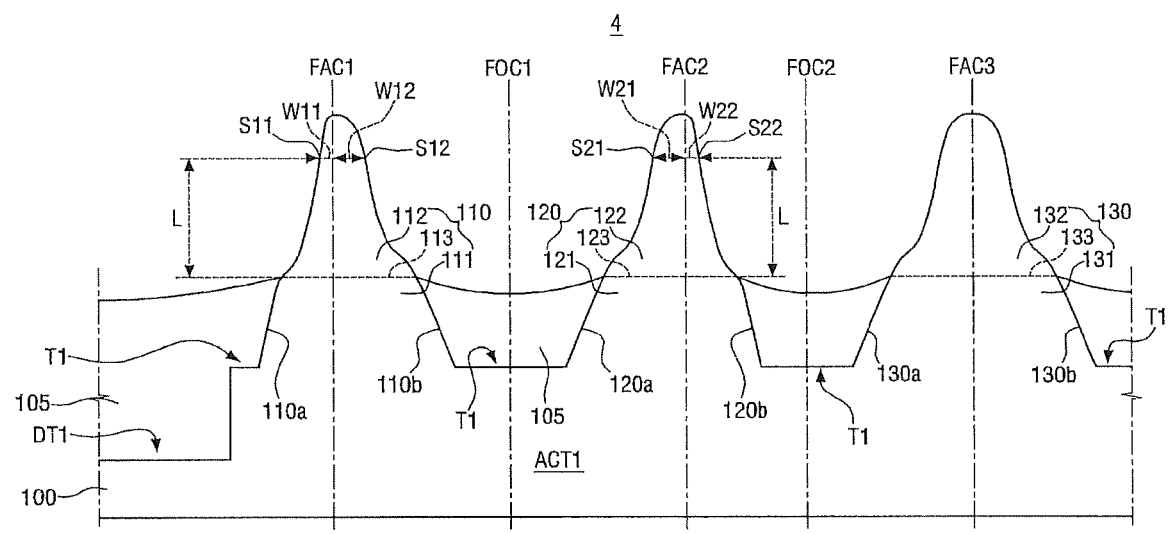
FIG. 8 is a view illustrating a semiconductor device according to some embodiments of the present inventive concept.

Referring now to FIG. 8, a diagram illustrating s semiconductor device according to some embodiments of the present inventive concept will be discussed. For the convenience of explanation, the semiconductor device according embodiments illustrated in FIG. 8 will be discussed focusing on the differences between embodiments discussed above and embodiments illustrated in FIG. 8.

Referring now to FIG. 8, in the semiconductor device 4 according to some embodiments of the present inventive concept, the third fin-shaped pattern 130 may be symmetric with respect to the third fin center line (FAC3).

In particular, with respect to the third fin center line (FAC3), the fifth sidewall 130a of the third fin-shaped pattern 130 and the sixth sidewall 130b of the third fin-shaped pattern 130 may be symmetric to each other. Thus, the second fin-shaped pattern 120 and the third fin-shaped pattern 130 may be asymmetric.

Unlike that shown in FIG. 8, the third fin-shaped pattern 130 which is symmetric with respect to the third fin center line (FAC3) may be formed in another active region, not the first active region (ACT1).

Figure 9:
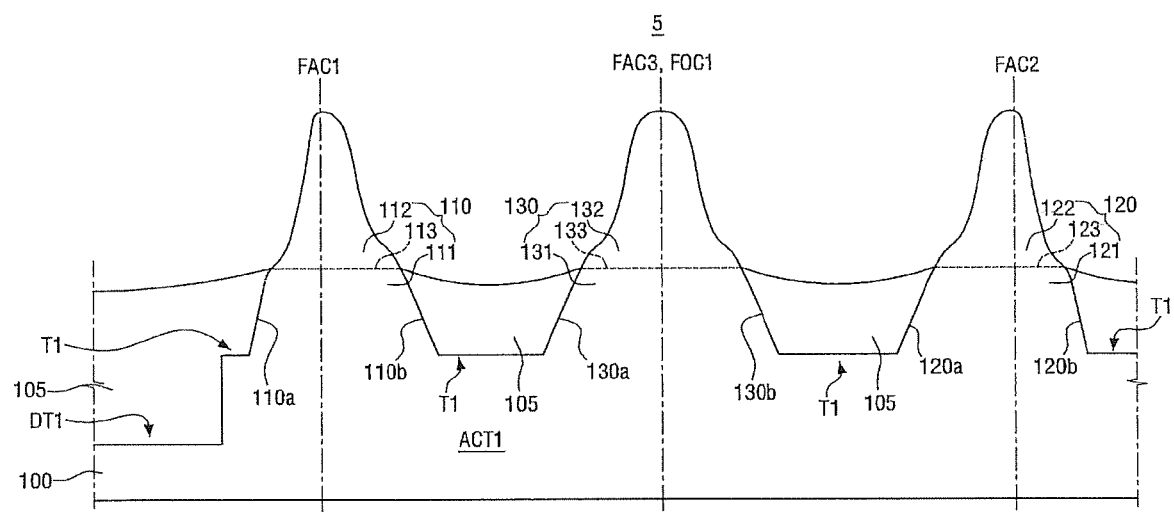
FIG. 9 is a view for illustrating a semiconductor device according to some embodiments of the present inventive concept.

FIG. 9 is a diagram illustrating a semiconductor device according to some embodiments of the present inventive concept. For the convenience of explanation, the semiconductor device illustrated in FIG. 9 will be discussed focusing on the differences between embodiments discussed above and embodiments illustrated in FIG. 9.

Referring to FIG. 9, in the semiconductor device 5 according to some embodiments of the present inventive concept, the third fin-shaped pattern 130 may be disposed between the first fin-shaped pattern 110 and the second fin-shaped pattern 120. The third fin-shaped pattern 130 may be symmetric with respect to the third fin center line (FAC3).

Furthermore, the first field center line (FOC1) located away from the first fin center line (FAC1) and the second fin center line (FAC2) by the same distance between the first fin center line (FAC1) and the second fin center line (FAC2) may be defined in the third fin-shaped pattern 130.

In FIG. 9, the third fin-shaped pattern 130 and the first field center line (FOC1) have been shown to be defined at the same position; however, embodiments of the present inventive concept are not limited to this configuration.

Figure 10:
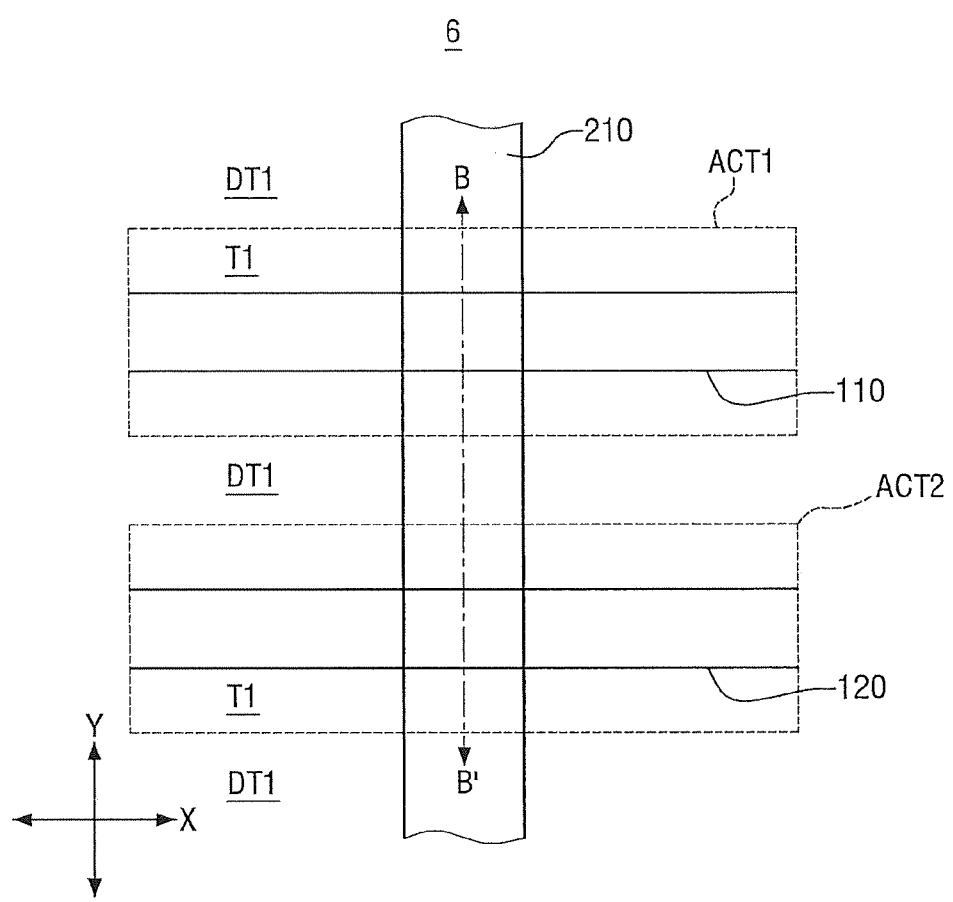
FIG. 10 is a layout diagram illustrating a semiconductor device according to some embodiments of the present inventive concept.
Figure 11:
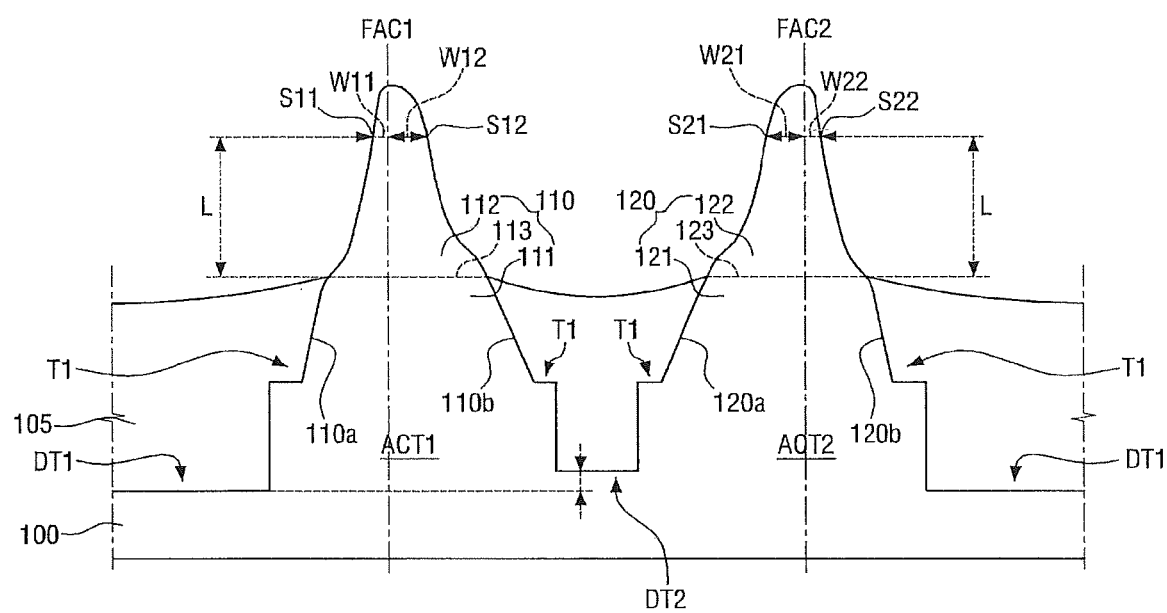
FIG. 11 is a cross section taken along the line B-B' of FIG. 10.

FIG. 10 is a layout diagram illustrating a semiconductor device according to some embodiments of the present inventive concept. FIG. 11 is a cross section taken along the line B-B' of FIG. 10. For the convenience of explanation, the semiconductor device illustrated in FIG. 10 will be discussed focusing on the differences between embodiments discussed above and embodiments illustrated in FIG. 10. FIG. 11 illustrates fin-shaped patterns and a field insulating film excluding a first gate electrode.

Referring to FIGS. 10 and 11, in the semiconductor device 6 according to the sixth embodiment of the present inventive concept, the first fin-shaped pattern 110 may be formed in a first active region (ACT1), and the second fin-shaped pattern 120 may be formed in a second active region (ACT2).

Each of the first fin-shaped pattern 110 and the second fin-shaped pattern 120 may be defined by the first shallow trench (T1) of a first depth.

However, the first active region (ACT1) and the second active region (ACT2) may be defined by the first deep trench (DTI) of a second depth and the second deep trench (DT2) of a third depth. The first active region (ACT1) and the second active region (ACT2) may be separated by the second deep trench (DT2) of a third depth.

In other words, the second deep trench (DT2) of a third depth is located between the second sidewall 110b of the first fin-shaped pattern 110 and the third sidewall 120a of the second fin-shaped pattern 120. The first deep trenches (DT1) of a second depth are formed adjacent to the first sidewall 110a of the first fin-shaped pattern 110 and the fourth sidewall 120b of the second fin-shaped pattern 120.

In the semiconductor device 6 according to some embodiments of the present inventive concept, the second depth of the first deep trench (DT1) may be equal to or larger than the third depth of the second deep trench (DT2).

Due to the loading effect of the first fin-shaped pattern 110 and the second fin-shaped pattern 120, the third depth of the second deep trench (DT2) may be smaller than the second depth of the first deep trench (DT1).

In the semiconductor device 6 according to some embodiments of the present inventive concept, the first sidewall 110a and second sidewall 110b of the first fin-shaped pattern 110 may be asymmetric with respect to the first fin center line (FAC1), and the third sidewall 120a and fourth sidewall 120b of the second fin-shaped pattern 120 may be asymmetric with respect to the second fin center line (FAC2).

As illustrated in FIG. 11, the first fin-shaped pattern 110 and the second fin-shaped pattern 120 have been shown to be symmetric with respect to the second deep trench (DT2), but this is only for convenience of explanation, and is not limited thereto.

Figure 12:
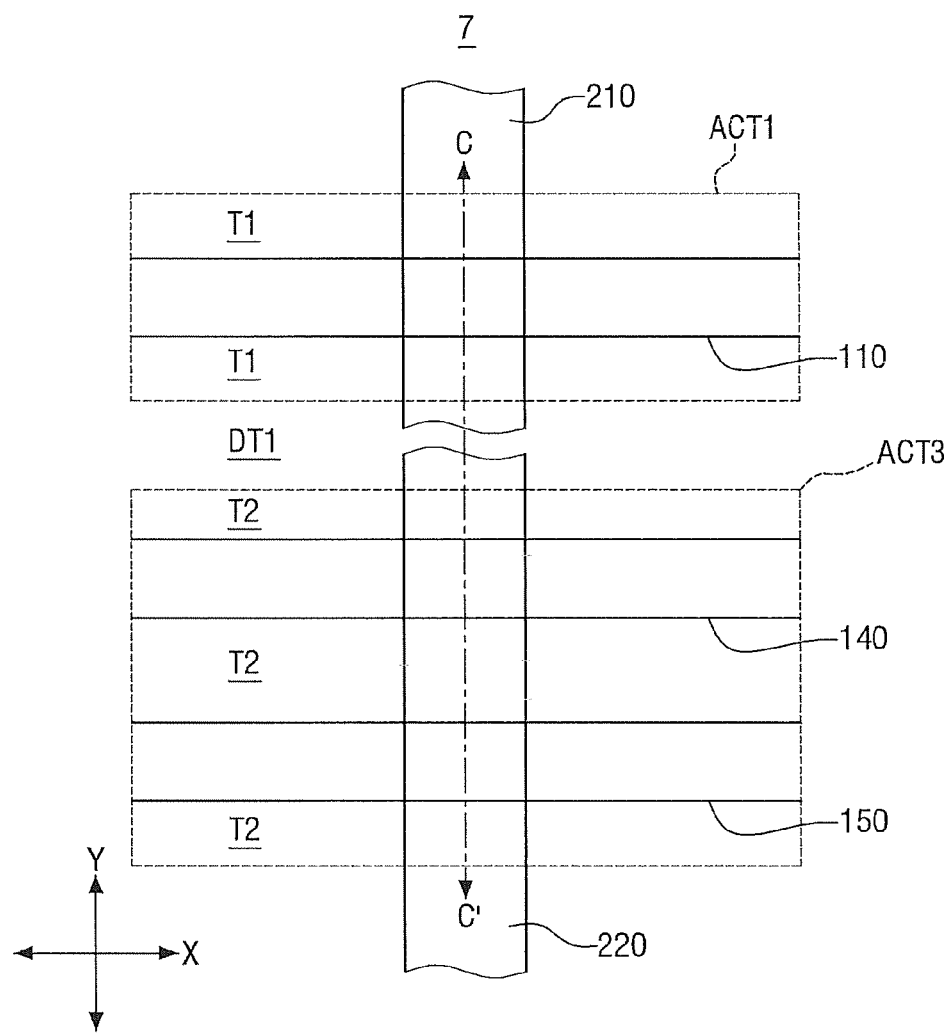
FIG. 12 is a layout diagram illustrating a semiconductor device according to some embodiments of the present inventive concept.
Figure 13:
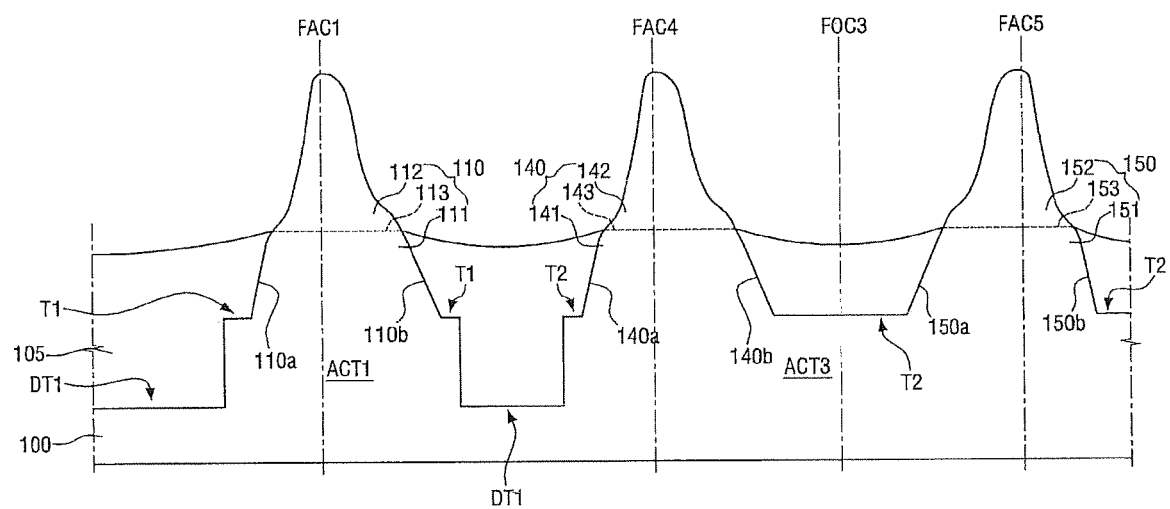
FIG. 13 is a cross section taken along the line C-C' of FIG. 12.

FIG. 12 is a layout diagram illustrating a semiconductor device according to some embodiments of the present inventive concept. FIG. 13 is a cross section taken along the line C-C' of FIG. 12. For the convenience of explanation, the semiconductor device illustrated in FIG. 12 will be discussed focusing on the differences between embodiments discussed above and embodiments illustrated in FIG. 12. FIG. 13 illustrates fin-shaped patterns and a field insulating film excluding a first gate electrode and a second gate electrode.

Referring to FIGS. 12 and 13, the first active region (ACT1) and the third active region (ACT3), which are spaces apart from each other, may be defined by the first deep trench (DT1).

The first fin-shaped pattern 110 may be formed in the first active region (ACT1) of the substrate 100, and the fourth fin-shaped pattern 140 and the fifth fin-shaped pattern 150 may be formed in the third active region (ACT3) of the substrate 100. The fourth fin-shaped pattern 140 and the fifth fin-shaped pattern 150 may be immediately adjacent to each other.

The first fin-shaped pattern 110 may be defined by the first shallow trench (T1) of a first depth which is smaller than the depth of the first deep trench (DT1).

The fourth fin-shaped pattern 140 and the fifth fin-shaped pattern 150 may be defined by the second shallow trench (T2) of a fourth depth which is smaller than the depth of the first deep trench (DT1). The second shallow trench (T2) is disposed between the fourth fin-shaped pattern 140 and the fifth fin-shaped pattern 150 to separate the fourth fin-shaped pattern 140 and the fifth fin-shaped pattern 150.

The filed insulating film 105 may be formed so as to fill at least a portion of the first shallow trench (T1), a part of the second shallow trench (T2) and a part of the first deep trench (DT1).

The first gate electrode 210 may extend in the second direction (Y) to cross the first fin-shaped pattern 110, and the second gate electrode 220 may extend in the second direction (Y) to cross the fourth fin-shaped pattern 140 and the fifth fin-shaped pattern 150.

The description of the second gate electrode 220 is substantially the same as that of the first gate electrode 210. Therefore, the description of the second gate electrode 220 will be omitted in the interest of brevity.

Unlike that shown in FIG. 12, the first gate electrode 210 and the second gate electrode 220 may connected with each other.

The fourth fin-shaped pattern 140 may include a seventh sidewall 140a and an eighth sidewall 140b facing each other. The fourth fin-shaped pattern 140 may include an upper portion 142 not contacting the field insulating film 105 and a lower portion 141 contacting the field insulating film 105. The fourth fin-shaped pattern 140 may include a fourth boundary 143 between the upper portion 142 of the fourth fin-shaped pattern 140 and the lower portion 141 of the fourth fin-shaped pattern 140. Furthermore, the fourth fin-shaped pattern 140 may include a fourth fin center line (FAC4) which is perpendicular to the fourth boundary 143 and meets the top of the fourth fin-shaped pattern 140.

The fifth fin-shaped pattern 150 may include a ninth sidewall 150a and a tenth sidewall 150b facing each other. The fifth fin-shaped pattern 150 may include an upper portion 152 not contacting the field insulating film 105 and a lower portion 151 contacting the field insulating film 105. The fifth fin-shaped pattern 150 may include a fifth boundary 153 between the upper portion 152 of the fifth fin-shaped pattern 150 and the lower portion 151 of the fifth fin-shaped pattern 150. Furthermore, the fifth fin-shaped pattern 150 may include a fifth fin center line (FAC5) which is perpendicular to the fifth boundary 153 and meets the top of the fifth fin-shaped pattern 150.

In the semiconductor device 7 according to some embodiments of the present inventive concept, the seventh sidewall 140a and eighth sidewall 140b of the fourth fin-shaped pattern 140 may be asymmetric with respect to the fourth fin center line (FAC4), and the ninth sidewall 150a and tenth sidewall 150b of the fifth fin-shaped pattern 150 may be asymmetric with respect to the fifth fin center line (FAC5).

For example, with respect to the fourth fin center line (FAC4), the seventh sidewall 140a of the upper portion of 142 of the fourth fin-shaped pattern 140 and the eighth sidewall 140b of the upper portion of 142 of the fourth fin-shaped pattern 140 may be asymmetric, and, with respect to the fifth fin center line (FAC5), the ninth sidewall 150a of the upper portion of 152 of the fifth fin-shaped pattern 150 and the tenth sidewall 150b of the upper portion of 152 of the fifth fin-shaped pattern 150 may be asymmetric.

Furthermore, a third field center line (FOC3) located away from the fourth fin center line (FAC4) and the fifth fin center line (FAC5) by the same distance may be defined between the fourth fin center line (FAC4) and the fifth fin center line (FAC5).

In the semiconductor device 7 according to some embodiments of the present inventive concept, the fourth fin-shaped pattern 140 and the fifth fin-shaped pattern 150 may be symmetric with respect to the third field center line (FOC3). With respect to the third field center line (FOC3), the eighth sidewall 140b of the fourth fin-shaped pattern 140 and the ninth sidewall 150a of the fifth fin-shaped pattern 150 may be symmetric, and the seventh sidewall 140a of the fourth fin-shaped pattern 140 and the tenth sidewall 150b of the fifth fin-shaped pattern 150 may be symmetric.

Figure 14:
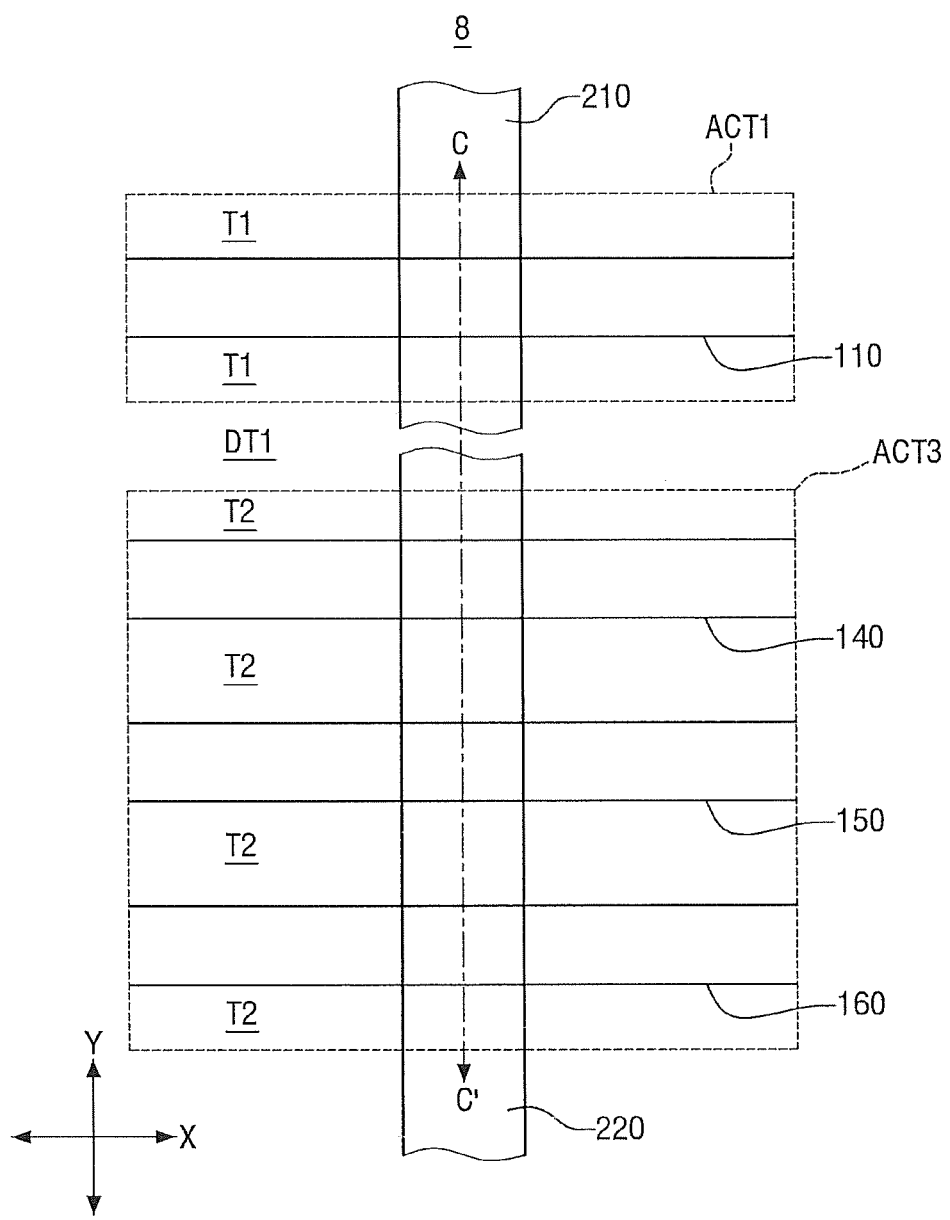
FIG. 14 is a layout diagram illustrating a semiconductor device according to some embodiments of the present inventive concept.

FIG. 14 is a layout diagram illustrating a semiconductor device according to some embodiments of the present inventive concept. For the convenience of explanation, the semiconductor device illustrated in FIG. 14 will be discussed focusing on the differences between embodiments discussed above and embodiments illustrated in FIG. 14. In the cross section taken along the line C-C' of FIG. 14, the third active region (ACT3) may be similar to any one of those of FIGS. 7 to 9.

Referring to FIG. 14, the semiconductor device 8 according to some embodiments of the present inventive concept may further include a sixth fin-shaped pattern 160 formed in the third active region (ACT3) of the substrate 100.

The sixth fin-shaped pattern 160 may extend in the first direction (X). The fourth fin-shaped pattern 140, the fifth fin-shaped pattern 150, and the sixth fin-shaped pattern 160 may be sequentially formed in the second direction (Y).

Like the fourth fin-shaped pattern 140 and the fifth fin-shaped pattern 150, the sixth fin-shaped pattern 160 may be asymmetric; however, embodiments of the present inventive concept are not limited thereto. Like the third fin-shaped pattern 130 in FIG. 8, the sixth fin-shaped pattern 160 may also be symmetric.

Unlike that shown in FIG. 14, the sixth fin-shaped pattern 160 may also be disposed between the fourth fin-shaped pattern 140 and the fifth fin-shaped pattern 150.

Figure 15:
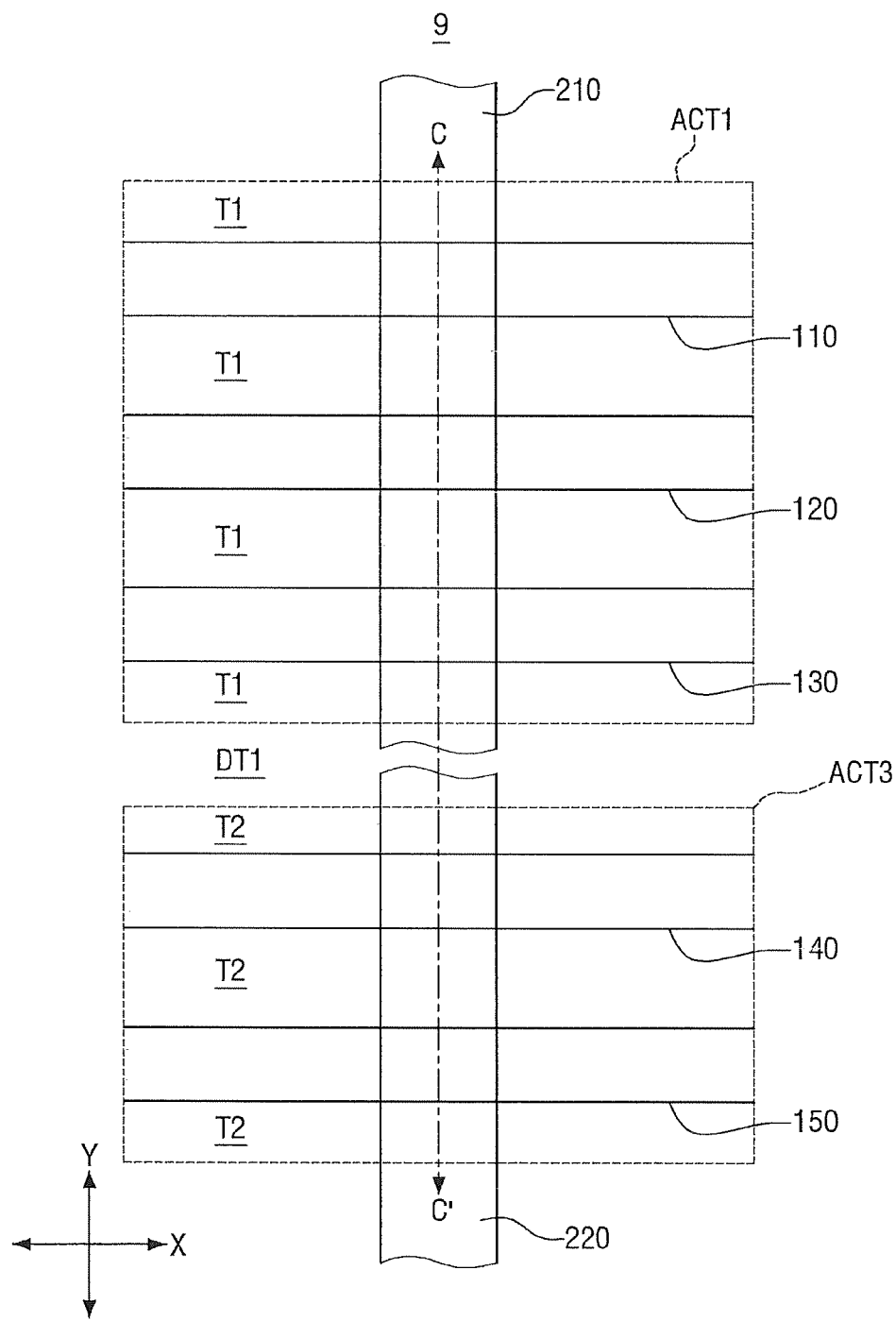
FIG. 15 is a layout diagram illustrating a semiconductor device according to some embodiments of the present inventive concept.

FIG. 15 is a layout diagram illustrating a semiconductor device according to some embodiments of the present inventive concept. For the convenience of explanation, the semiconductor device illustrated in FIG. 15 will be discussed focusing on the differences between embodiments discussed above and embodiments illustrated in FIG. 15. In the cross section taken along the line C-C' of FIG. 15, the first active region (ACT1) may be similar to any one of those of FIGS. 7 to 9.

Referring to FIG. 15, the semiconductor device 9 according to some embodiments of the present inventive concept may further include a second fin-shaped pattern 120 and a third fin-shaped pattern 130 formed in the first active region (ACT1) of the substrate 100. The second fin-shaped pattern 120 may be immediately adjacent to the first fin-shaped pattern 110.

The second fin-shaped pattern 120 may be asymmetric with respect to the second fin center line (FAC2). In other words, the third sidewall 120a and fourth sidewall 120b of the second fin-shaped pattern 120 may be asymmetric with respect to the second fin center line (FAC2).

Furthermore, the first fin-shaped pattern 110 and the second fin-shaped pattern 120 may be symmetric with respect to the first field center line (FOC1).

When the cross section taken along the line C-C' of FIG. 15 is the same as FIG. 7, the third fin-shaped pattern 130 may be asymmetric with respect to the third fine center line (FAC3).

Unlike this, when the cross section taken along the line C-C' of FIG. 15 is the same as FIG. 8, the third fin-shaped pattern 130 may be symmetric with respect to the third fine center line (FAC3).

Figure 16:
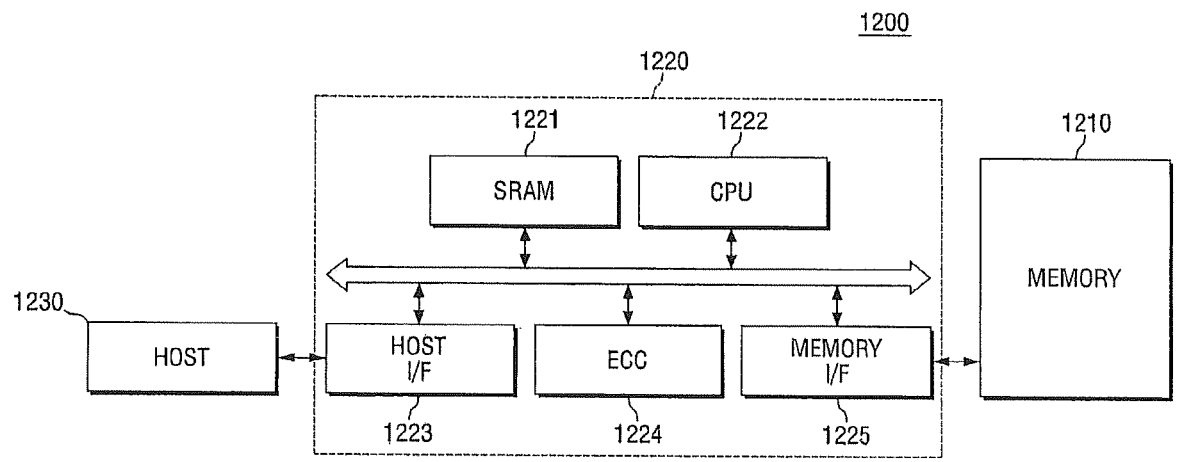
FIG. 16 is a block diagram of a memory card including the semiconductor devices according to some embodiments of the present inventive concept.

Referring now to FIG. 16, a block diagram illustrating a memory card including semiconductor devices according to some embodiments of the present inventive concept will be discussed. As illustrated in FIG. 16, memory 1210 including the semiconductor devices according to some embodiments of the present inventive concept can be used in the memory card 1200. The memory card 1200 may further include a memory controller 1220 for controlling the data exchange between a host 1230 and the memory 1210. SRAM 1221 can be used as the operation memory of a central processing unit (CPU) 1222. A host interface 1223 may include a protocol for exchanging data by connecting the host 1230 with the memory card 1200. An error correction code 1224 serves to detect and correct the errors read from the memory 1210. A memory interface 1225 serves to interface with the memory 1210. The central processing unit (CPU) 1222 serves to perform the overall control operation associated with the data exchange of the memory controller 1220.

Figure 17:
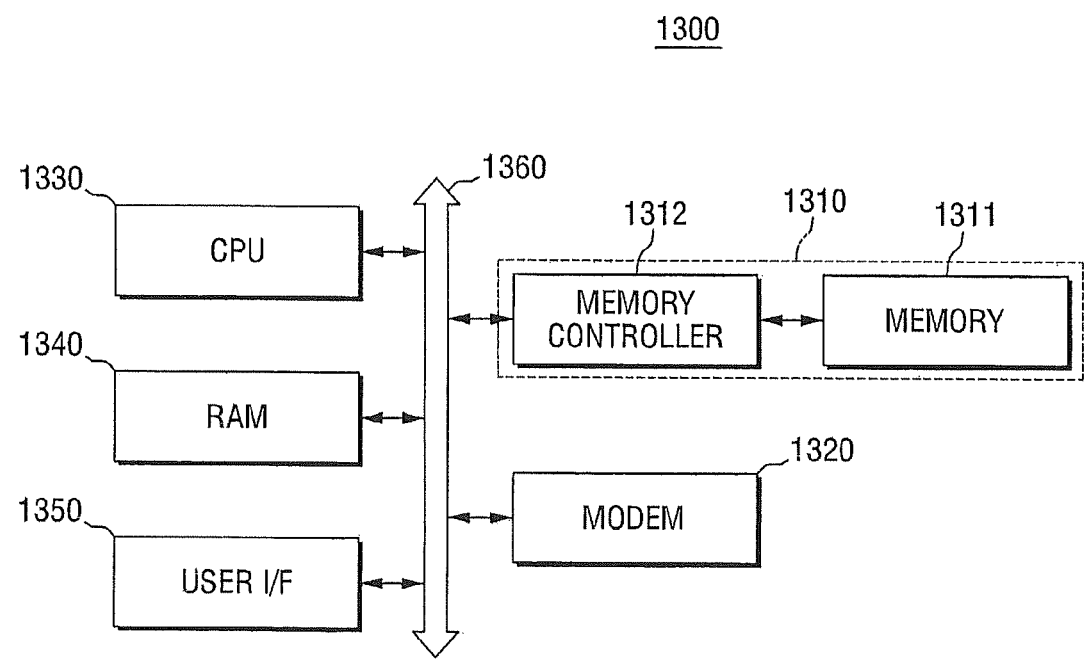
FIG. 17 is a block diagram of an information processing system including the semiconductor devices according some embodiments of the present inventive concept.

Referring now to FIG. 17, a block diagram of an information processing system including semiconductor devices according to some embodiments of the present inventive concept will be discussed. As illustrated in FIG. 17, the information processing system 1300 may further include a memory system 1310 including the semiconductor devices according to some embodiments of the present inventive concept. The information processing system 1300 may include the memory system 1310, a modem 1320, a central processing unit (CPU) 1330, RAM 1340, and a user interface 1350, each of which is electrically connected with a system bus 1360. The memory system 1310 may include memory 1311 and a memory controller 1312, and may have substantially the same configuration as the memory card shown in FIG. 16. Data processed by the central processing unit (CPU) 1330 or data received from external devices may be stored in the memory system 1310. The information processing system 1300 can be applied to memory cards; SSDs, camera image sensors, and other various chip sets. For example, the memory system 1310 may be configured to employ SSD, and, in this case, the information processing system 1300 can stably and reliably process a large amount of data.

Figure 18:
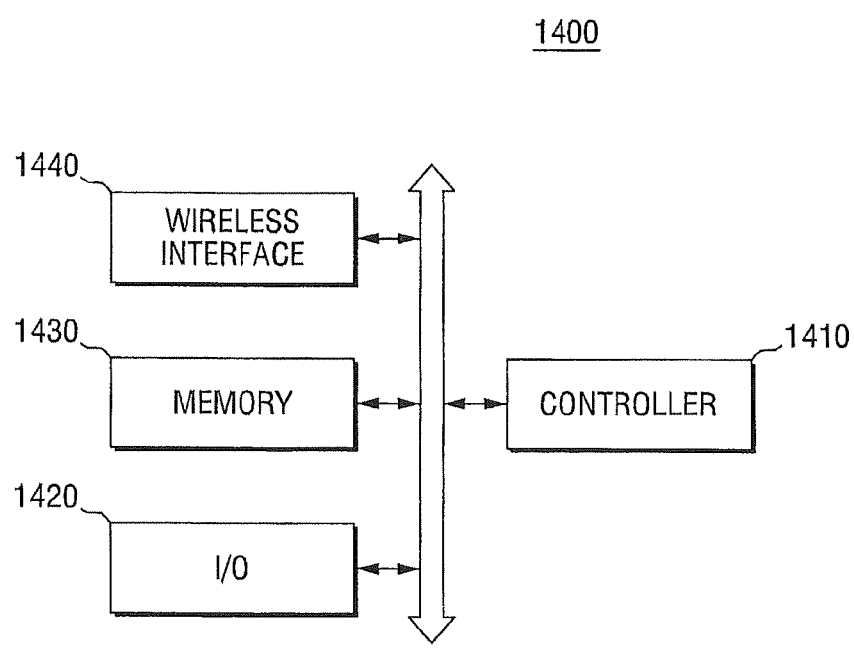
FIG. 18 is a block diagram of an electronic appliance including the semiconductor devices according to some embodiments of the present inventive concept.

Referring now to FIG. 18, a block diagram of an electronic appliance including semiconductor devices according to some embodiments of the present inventive concept will be discussed. As illustrated in FIG. 18, the electronic appliance 1400 may include the semiconductor devices according to some embodiments of the present inventive concept. The electronic appliance 1400 can be used in wireless communication apparatuses, for example, PDAs, notebook computers, portable computers, web tablets, wireless telephones, and wireless digital music players, or various apparatuses for communicating information in a wireless communication environment.

The electronic appliance 1400 may include a controller 1410, an input/out (I/O) unit 1420, memory 1430, and a wireless interface 1440. In these embodiments, the memory 1430 may include the semiconductor devices according to the embodiments of the present inventive concept. The controller 1410 may include a microprocessor, a digital signal processor, or a processor similar thereto. The memory 1430 can be used in storing the commands (or user data) processed by the controller 1410. The wireless interface 1440 can be used in communicating data through a wireless data network. The wireless interface 1440 may include an antenna and/or a wireless transceiver. The electronic appliance 1400 can use third-generation communication system protocols, such as CDMA, GSM, NADC, E-TDMA, WCDMA, and CDMA2000.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device, comprising:
   a first fin pattern including first and second sidewalls opposite one another;
   a second fin pattern including third and fourth sidewalls opposite one another;
   a third fin pattern between the first fin pattern and the second fin pattern;
   a field insulating film contacting at least a portion of the first fin pattern, at least a portion of the second fin pattern and at least a portion of the third fin pattern; and
   a gate structure including a gate insulating film and a gate electrode on the gate insulating film, and crossing at least one of the first through third fin patterns, the gate insulating film being in direct contact with an upper surface of the field insulating film,
   wherein the first fin pattern comprises:
      a lower portion of the first fin pattern contacting the field insulating film;
      an upper portion of the first fin pattern not contacting the field insulating film;
      a first boundary located at the upper surface of the field insulating film and between the lower portion of the first fin pattern and the upper portion of the first fin pattern; and
      a first fin center line perpendicular to the first boundary and meeting a top of the upper portion of the first fin pattern,
   wherein the second fin pattern comprises:
      a lower portion of the second fin pattern contacting the field insulating film;
      an upper portion of the second fin pattern not contacting the field insulating film;
      a second boundary between the lower portion of the second fin pattern and the upper portion of the second fin pattern; and
      a second fin center line perpendicular to the second boundary and meeting a top of the upper portion of the second fin pattern,
   wherein the first sidewall of the upper portion of the first fin pattern and the second sidewall of the upper portion of the first fin pattern are asymmetric with respect to the first fin center line,
   wherein the third sidewall of the upper portion of the second fin pattern and the fourth sidewall of the upper portion of the second fin pattern are asymmetric with respect to the second fin center line, and
   the upper portion of the first fin pattern is a semiconductor.

2. The semiconductor device of claim 1:
   wherein, in the upper portion of the first fin pattern having a first distance from the first boundary, a slope of the first sidewall is defined by a first slope, a slope of the second sidewall is defined by a second slope, a width between the first fin center line and the first sidewall is defined by a first width, and a width between the first fin center line and the second sidewall is defined by a second width, and
   wherein the first slope and the second slope are different from each other, or the first width and the second width are different from each other.

3. The semiconductor device of claim 2, wherein the first slope and the second slope are different from each other, and the first width and the second width are different from each other.

4. The semiconductor device of claim 1, wherein the first sidewall of the lower portion of the first fin pattern and the second sidewall of the lower portion of the first fin pattern are asymmetric with respect to the first fin center line.

5. The semiconductor device of claim 1, wherein the third fin pattern comprises:
   a lower portion of the third fin pattern contacting the field insulating film;
   an upper portion of the third fin pattern not contacting the field insulating film;
   a third boundary between the lower portion of the third fin pattern and the upper portion of the third fin pattern; and
   a third fin center line perpendicular to the third boundary and meeting a top of the upper portion of the third fin pattern, and
   wherein a fifth sidewall of the third fin pattern and a sixth sidewall of the third fin pattern are asymmetric with respect to the third fin center line.

6. The semiconductor device of claim 5, the fifth sidewall of the upper portion of the third fin pattern and the sixth sidewall of the upper portion of the third fin pattern are asymmetric with respect to the third fin center line.

7. The semiconductor device of claim 5:
   wherein the second fin pattern and the third fin pattern are immediately adjacent to one another,
   wherein a field center line located away from the second fin center line and the third fin center line by a same distance is defined between the second fin center line and the third fin center line, and
   wherein the fourth sidewall of the second fin pattern and the fifth sidewall of the third fin pattern are symmetric with respect to the field center line.

8. The semiconductor device of claim 1, wherein the third fin pattern comprises:
   a lower portion of the third fin pattern contacting the field insulating film;

an upper portion of the third fin pattern not contacting the field insulating film;
a third boundary between the lower portion of the third fin pattern and the upper portion of the third fin pattern; and
a third fin center line perpendicular to the third boundary and meeting a top of the upper portion of the third fin pattern, and
wherein a fifth sidewall of the third fin pattern and a sixth sidewall of the third fin pattern are symmetric with respect to the third fin center line.

9. The semiconductor device of claim 1:
wherein in the lower portion of the first fin pattern having a first distance from the first boundary, a slope of the first sidewall is defined by a first slope, a slope of the second sidewall is defined by a second slope, a width between the first fin center line and the first sidewall is defined by a first width, and a width between the first fin center line and the second sidewall is defined by a second width, and
wherein the first slope is substantially the same as the second slope, and the first width is substantially the same as the second width.

10. A semiconductor device, comprising:
a first fin pattern including first and second sidewalls opposite one another;
a second fin pattern including third and fourth sidewalls opposite one another;
a third fin pattern between the first fin pattern and the second fin pattern;
a field insulating film contacting at least a portion of the first fin pattern, at least a portion of the second fin pattern and at least a portion of the third fin pattern; and
a gate structure including a gate insulating film and a gate electrode on the gate insulating film, and crossing at least one of the first through third fin patterns, the gate insulating film being in direct contact with an upper surface of the field insulating film,
wherein the first fin pattern comprises:
  a lower portion of the first fin pattern contacting the field insulating film;
  an upper portion of the first fin pattern not contacting the field insulating film;
  a first boundary located at the upper surface of the field insulating film and between the lower portion of the first fin pattern and the upper portion of the first fin pattern; and
  a first fin center line perpendicular to the first boundary and meeting a top of the upper portion of the first fin pattern,
wherein the second fin pattern comprises:
  a lower portion of the second fin pattern contacting the field insulating film;
  an upper portion of the second fin pattern not contacting the field insulating film;
  a second boundary between the lower portion of the second fin pattern and the upper portion of the second fin pattern; and
  a second fin center line perpendicular to the second boundary and meeting a top of the upper portion of the second fin pattern,
wherein the third fin pattern comprises:
  a lower portion of the third fin pattern contacting the field insulating film;
  an upper portion of the third fin pattern not contacting the field insulating film;
  a third boundary between the lower portion of the third fin pattern and the upper portion of the third fin pattern; and
  a third fin center line perpendicular to the third boundary and meeting a top of the upper portion of the third fin pattern,
wherein the first sidewall of the upper portion of the first fin pattern and the second sidewall of the upper portion of the first fin pattern are asymmetric with respect to the first fin center line,
wherein the third sidewall of the upper portion of the second fin pattern and the fourth sidewall of the upper portion of the second fin pattern are asymmetric with respect to the second fin center line,
wherein a fifth sidewall of the third fin pattern and a sixth sidewall of the third fin pattern are symmetric with respect to the third fin center line, and
wherein the upper portion of the first fin pattern is a semiconductor.

11. A semiconductor device, comprising:
a first fin-shaped pattern including first and second sidewalls opposite one another;
a field insulating film contacting at least a portion of the first fin-shaped pattern; and
a gate structure including a gate insulating film and a gate electrode on the gate insulating film, and crossing the first fin-shaped pattern, the gate insulating film being in direct contact with an upper surface of the field insulating film, wherein the first fin-shaped pattern comprises:
  a lower portion of the first fin-shaped pattern contacting the field insulating film;
  an upper portion of the first fin-shaped pattern not contacting the field insulating film;
  a first boundary located at the upper surface of the field insulating film and between the lower portion of the first fin-shaped pattern and the upper portion of the first fin-shaped pattern; and
  a first fin center line perpendicular to the first boundary and meeting the top of the upper portion of the first fin-shaped pattern,
wherein the first sidewall of the upper portion of the first fin-shaped pattern and the second sidewall of the upper portion of the first fin-shaped pattern are asymmetric with respect to the first fin center line,
wherein, in the upper portion of the first fin-shaped pattern having a first distance from the first boundary, a slope of the first sidewall is defined by a first slope, a slope of the second sidewall is defined by a second slope, a width between the first fin center line and the first sidewall is defined by a first width, and a width between the first fin center line and the second sidewall is defined by a second width,
wherein the first slope and the second slope are different from each other, or the first width and the second width are different from each other, and
wherein the upper portion of the first fin-shaped pattern is a semiconductor.

12. The semiconductor device of claim 11:
wherein the first sidewall includes a first inflection point, and the second sidewall includes a second inflection point; and
wherein a distance from the first boundary to the first inflection point is different from a distance from the first boundary to the second inflection point.

13. The semiconductor device of claim 12, wherein the first inflection point and the second inflection point are located over the upper surface of the field insulating film.

14. The semiconductor device of claim 11, further comprising:
- a second fin-shaped pattern including third and fourth sidewalls opposite one another and being immediately adjacent to the first fin-shaped pattern;
- a first trench between the second sidewall of the first fin-shaped pattern and the third sidewall of the second fin-shaped pattern, the second sidewall and the third sidewall opposite one another; and
- a second trench adjacent to the first sidewall of the first fin-shaped pattern and the fourth sidewall of the second fin-shaped pattern,
- wherein the field insulating film fills at least a portion of the first trench and at least a portion of the second trench;
- wherein the second fin-shaped pattern comprises:
- a lower portion of the second fin-shaped pattern contacting the field insulating film;
- an upper portion of the second fin-shaped pattern not contacting the field insulating film;
- a second boundary between the lower portion of the second fin-shaped pattern and the upper portion of the second fin-shaped pattern; and
- a second fin center line perpendicular to the second boundary and meeting the top of the upper portion of the second fin-shaped pattern, and
- wherein the third sidewall of the upper portion of the second fin-shaped pattern and the fourth sidewall of the upper portion of the second fin-shaped pattern are asymmetric with respect to the second fin center line.

15. The semiconductor device of claim 14:
- wherein the first trench defines the first fin-shaped pattern and the second fin-shaped pattern;
- wherein a first depth of the first trench is smaller than a second depth of the second trench;
- wherein a field center line located away from the first fin center line and the second fin center line by a same distance is defined between the first fin center line and the second fin center line; and
- wherein the second sidewall of the upper portion of the first fin-shaped pattern and the third sidewall of the upper portion of the second fin-shaped pattern are symmetric with respect to the field center line.

16. The semiconductor device of claim 15:
- wherein the first trench is on both sides of the second fin-shaped pattern;
- wherein the semiconductor device further comprises a third fin-shaped pattern defined by the first trench and including fifth and sixth sidewalls opposite one another between the second fin-shaped pattern and the second trench;
- wherein the third fin-shaped pattern comprises:
- a lower portion of the third fin-shaped pattern contacting the field insulating film;
- an upper portion of the third fin-shaped pattern not contacting the field insulating film;
- a third boundary between the lower portion of the third fin-shaped pattern and the upper portion of the third fin-shaped pattern; and
- a third fin center line perpendicular to the third boundary and meeting the top of the upper portion of the third fin-shaped pattern; and
- wherein the fifth sidewall of the upper portion of the third fin-shaped pattern and the sixth sidewall of the upper portion of the third fin-shaped pattern are asymmetric with respect to the third fin center line.

17. The semiconductor device of claim 14:
- wherein a first depth of the first trench is equal to or smaller than a second depth of the second trench; and
- wherein the first trench and the second trench define an active region.

18. The semiconductor device of claim 11, further comprising:
- a second fin-shaped pattern comprising third and fourth sidewalls opposite one another,
- wherein the second fin-shaped pattern comprises:
- a lower portion of the second fin-shaped pattern contacting the field insulating film;
- an upper portion of the second fin-shaped pattern not contacting the field insulating film;
- a second boundary between the lower portion of the second fin-shaped pattern and the upper portion of the second fin-shaped pattern; and
- a second fin center line perpendicular to the second boundary and meeting the top of the upper portion of the second fin-shaped pattern; and
- wherein the third sidewall of the second fin-shaped pattern and the fourth sidewall of the second fin-shaped pattern are symmetric with respect to the second fin center line.

* * * * *